United States Patent
Sengoku

(10) Patent No.: US 10,089,173 B2
(45) Date of Patent: Oct. 2, 2018

(54) ERROR DETECTION CONSTANTS OF SYMBOL TRANSITION CLOCKING TRANSCODING

(71) Applicant: QUALCOMM Incorporated, San Diego, CA (US)

(72) Inventor: Shoichiro Sengoku, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 49 days.

(21) Appl. No.: 14/949,435

(22) Filed: Nov. 23, 2015

(65) Prior Publication Data

US 2016/0147596 A1 May 26, 2016

Related U.S. Application Data

(60) Provisional application No. 62/236,522, filed on Oct. 2, 2015, provisional application No. 62/216,692, filed
(Continued)

(51) Int. Cl.
*G06F 11/10* (2006.01)
*H03M 13/00* (2006.01)
(Continued)

(52) U.S. Cl.
CPC .......... *G06F 11/1004* (2013.01); *H03M 5/00* (2013.01); *H03M 13/03* (2013.01); *H03M 13/63* (2013.01);
(Continued)

(58) Field of Classification Search
CPC ... H04L 1/0072; H04L 1/0061; H04L 1/0041; H04L 1/0042; H04L 1/0047; H04L 7/033; H04L 7/041
(Continued)

(56) References Cited

U.S. PATENT DOCUMENTS

| | | | |
|---|---|---|---|
| 6,505,321 B1 * | 1/2003 | MacLellan | G06F 11/10 714/52 |
| 6,615,387 B1 * | 9/2003 | Williamson | H03M 13/091 714/758 |

(Continued)

FOREIGN PATENT DOCUMENTS

| | | |
|---|---|---|
| CN | 101493804 A | 7/2009 |
| WO | WO-2015054548 | 4/2015 |
| WO | WO-2015195329 | 12/2015 |

OTHER PUBLICATIONS

Kanich C, "Lecture 3: Data Link I—Framing and Error Control", CSE 123 Computer Networks, Jul. 10, 2006, 10 Pages. Retrieved from Internet, URL http://cseweb.ucsd.edu/classes/su11/cse123-a/slides/123-su11-I3.pdf.
(Continued)

*Primary Examiner* — James C Kerveros
(74) *Attorney, Agent, or Firm* — Loza & Loza LLP

(57) ABSTRACT

Apparatus, systems and methods for error detection in transmissions on a multi-wire interface are disclosed. A method for transmitting data on the multi-wire interface includes transmitting data on a multi-wire interface includes obtaining a plurality of bits to be transmitted over a plurality of connectors, converting the plurality of bits into a sequence of symbols, and transmitting the sequence of symbols on the plurality of connectors. A predetermined number of least significant bits in the plurality of bits may be used for error detection. The predetermined number of least significant bits may have a constant value that is different from each of a plurality of error values. A symbol error affecting one or two symbols in the sequence of symbols may cause a decoded version of the predetermined number of least significant bits to have value that is one of a plurality of error values.

25 Claims, 23 Drawing Sheets

Related U.S. Application Data on Sep. 10, 2015, provisional application No. 62/084,998, filed on Nov. 26, 2014.

(51) Int. Cl.
| | |
|---|---|
| *H03M 13/03* | (2006.01) |
| *H03M 5/00* | (2006.01) |
| *H04L 1/00* | (2006.01) |
| *H04L 25/02* | (2006.01) |
| *H04L 25/03* | (2006.01) |
| *H04L 25/14* | (2006.01) |
| *H04L 25/493* | (2006.01) |
| *H04L 27/38* | (2006.01) |
| *H04L 1/24* | (2006.01) |
| *H04L 7/033* | (2006.01) |

(52) U.S. Cl.
CPC ............ *H04L 1/004* (2013.01); *H04L 1/0041* (2013.01); *H04L 1/0061* (2013.01); *H04L 1/245* (2013.01); *H04L 7/033* (2013.01); *H04L 25/0264* (2013.01); *H04L 25/0272* (2013.01); *H04L 25/03286* (2013.01); *H04L 25/14* (2013.01); *H04L 25/493* (2013.01); *H04L 27/38* (2013.01)

(58) Field of Classification Search
USPC ............................................ 14/807; 714/807
See application file for complete search history.

(56) References Cited

U.S. PATENT DOCUMENTS

| | | | | |
|---|---|---|---|---|
| 7,191,385 B2* | 3/2007 | Olaker | ................. | H04W 64/00 |
| | | | | 714/780 |
| 7,502,982 B2* | 3/2009 | Silvus | ............... | H03M 13/2966 |
| | | | | 714/753 |
| 7,526,710 B2* | 4/2009 | Sawaguchi | ........ | G11B 20/1833 |
| | | | | 714/755 |
| 7,559,004 B1* | 7/2009 | Chang | ................... | H03M 13/11 |
| | | | | 714/708 |
| 7,657,821 B1 | 2/2010 | Wakerly et al. | | |
| 7,694,204 B2 | 4/2010 | Schmidt et al. | | |
| 7,769,048 B2* | 8/2010 | Sharma | ............... | G06F 13/4286 |
| | | | | 370/474 |
| 7,949,931 B2 | 5/2011 | Lastras-Montano | | |
| 8,028,216 B1* | 9/2011 | Yeo | ....................... | H03M 5/145 |
| | | | | 714/755 |
| 8,099,648 B2* | 1/2012 | Schmidt | ................ | H04L 1/0045 |
| | | | | 714/758 |
| 8,196,011 B2 | 6/2012 | Izumita et al. | | |
| 8,401,120 B1 | 3/2013 | Ozgur | | |
| 8,462,891 B2 | 6/2013 | Kizer et al. | | |
| 8,522,122 B2 | 8/2013 | Alves et al. | | |
| 8,824,581 B2* | 9/2014 | Okada | ................. | H04L 25/4908 |
| | | | | 341/180 |
| 8,910,009 B1 | 12/2014 | Tang et al. | | |
| 2003/0152154 A1 | 8/2003 | Johnson | | |
| 2003/0237041 A1* | 12/2003 | Cole | ................. | G11B 20/1833 |
| | | | | 714/776 |
| 2007/0162822 A1* | 7/2007 | Choi | .................... | H03M 13/116 |
| | | | | 714/758 |
| 2008/0028281 A1* | 1/2008 | Miyazaki | ........... | H03M 13/1102 |
| | | | | 714/776 |
| 2009/0132894 A1* | 5/2009 | Xu | ........................ | H03M 13/27 |
| | | | | 714/780 |
| 2010/0050053 A1* | 2/2010 | Wilson | ................. | G06F 11/1068 |
| | | | | 714/773 |
| 2011/0209027 A1* | 8/2011 | Schmidt | ................ | H04L 1/0045 |
| | | | | 714/752 |
| 2012/0179949 A1* | 7/2012 | Wang | .................... | H04L 1/0041 |
| | | | | 714/752 |
| 2014/0270026 A1 | 9/2014 | Sengoku et al. | | |
| 2015/0100862 A1 | 4/2015 | Sengoku | | |
| 2016/0149729 A1 | 5/2016 | Sengoku | | |

OTHER PUBLICATIONS

International Search Report and Written Opinion—PCT/US2015/062504—ISA/EPO—Feb. 25, 2016.

\* cited by examiner

FIG. 11

| n | $r^n$ hex | $r^n$ bin |
|---|---|---|
| 0 | 00000001 | 00000000000000000000000000000001 |
| 1 | 00000003 | 00000000000000000000000000000011 |
| 2 | 00000009 | 00000000000000000000000000001001 |
| 3 | 0001B | 00000000000000000000000000011011 |
| 4 | 00000051 | 00000000000000000000000001010001 |
| 5 | 000000F3 | 00000000000000000000000011110011 |
| 6 | 000002D9 | 00000000000000000000001011011001 |
| 7 | 0000088B | 00000000000000000000100010001011 |
| 8 | 000019A1 | 00000000000000000001100110100001 |
| 9 | 00004CE3 | 00000000000000000100110011100011 |
| 10 | 0000E6A9 | 00000000000000001110011010101001 |
| 11 | 0002B3FB | 00000000000000101011001111111011 |
| 12 | 0081BF1 | 00000000000010000001101111110001 |
| 13 | 01853D3 | 00000001100001010011110101010011 |
| 14 | 048FB79 | 00000100100011111011011101111001 |
| 15 | 0DAF26B | 11011010111100100110001101011011 |

1100
1104

| n | $r^n$ hex | $r^n$ bin |
|---|---|---|
| 0 | 00000001 | 00000000000000000000000000000001 |
| 1 | 00000005 | 00000000000000000000000000000101 |
| 2 | 00000019 | 00000000000000000000000000011001 |
| 3 | 0000007D | 00000000000000000000000001111101 |
| 4 | 00000271 | 00000000000000000000001001110001 |
| 5 | 00000C35 | 00000000000000000000110000110101 |
| 6 | 00003D09 | 00000000000000000011110100001001 |
| 7 | 0001312D | 00000000000000010011000100101101 |
| 8 | 0005F5E1 | 00000000000001011111010111100001 |
| 9 | 001DCD65 | 00000000000111011100110101100101 |
| 10 | 009502F9 | 00000000100101010000001011111001 |
| 11 | 002E90EDD | 00000010111010010000111011011101 |
| 12 | 00E8D4A51 | 00001110100011010100101001010001 |
| 13 | 048C27395 | 01001000110000100111001110010101 |
| 14 | 16BCC41E9 | 00010110101111001100010000111001 |
| 15 | 71AFD498D | 01110001101011111101010010001101 |

1102
1106

| Dec | Hex | Bin | $(e^x_k, e^x_{k-1})$ | list |
|---|---|---|---|---|
| -21 | EB | 11101011 | -4, 1 | |
| -18 | EE | 11101110 | -3, 3 | |
| -17 | EF | 11101111 | -3, 2 | |
| -16 | F0 | 11110000 | -4, -4 | -3, 1 |
| -13 | F3 | 11110011 | -2, 3 | -3, -2 |
| -12 | F4 | 11110100 | -3, -3 | -2, 2 |
| -9 | F7 | 11110111 | -1, 4 | -2, -1 |
| -8 | F8 | 11111000 | -2, -2 | -1, 3 |
| -7 | F9 | 11111001 | -2, 3 | |
| -4 | FC | 11111100 | -1, -1 | |
| -3 | FD | 11111101 | -1, -2 | |
| 3 | 03 | 00000011 | 1, 2 | |
| 4 | 04 | 00000100 | 1, 1 | |
| 7 | 07 | 00000111 | 2, 3 | |
| 8 | 08 | 00001000 | 2, 2 | 1, 3 |
| 9 | 09 | 00001001 | 1, -4 | 2, 1 |
| 13 | 0D | 00001101 | 2, -3 | 3, 2 |
| 16 | 10 | 00010000 | 4, 4 | 3, -1 |
| 17 | 11 | 00010001 | 3, -2 | |
| 18 | 12 | 00010010 | 3, -3 | |
| 21 | 15 | 00010101 | 4, -1 | |

| r | r-1 | Longest $2^n$ for $e_k$ or $e_{k-1}$ | Longest non-zero LSB of $(e_k - e_{k-1})$ |
|---|---|---|---|
| 3 = 00011₂ | 00010₂ | 2 = 00010₂ | 00100₂ |
| 5 = 00101₂ | 00100₂ | 4 = 00100₂ | 01000₂ |
| 7 = 00111₂ | 00110₂ | 4 = 00100₂ | 00100₂ |
| 9 = 01001₂ | 01000₂ | 8 = 01000₂ | 01000₂ |
| 11 = 01011₂ | 01010₂ | 8 = 01000₂ | 01000₂ |
| 15 = 01111₂ | 01110₂ | 8 = 01000₂ | 01110000₂ |
| 23 = 10111₂ | 10110₂ | 16 = 10000₂ | 10110000₂ |

$(2^n \cdot r - 2^n) = 2^n(r-1)$ — Shift r-1 left by n-1 digits

Replace LSB of r with 0 e.g.,
r=3=00011₂ → r-1=00010₂
r=5=00101₂ → r-1=00100₂
r=7=00111₂ → r-1=00110₂
r=15=01111₂ → r-1=01110₂
r=23=10111₂ → r-1=10110₂

| m | \multicolumn{11}{c|}{r} | |
|---|---|---|---|---|---|---|---|---|---|---|---|---|
|   | 3 | 5 | 7 | 9 | 11 | 13 | 15 | 17 | 19 | 21 | 23 | |
| 3 | 3 | 5 | 6 | 7 | 5 | 6 | 8 | 9 | 8 | 7 | 6 | Single symbol error |
| 4 | 8 | 10 | 12 | 13 | 12 | 14 | 15 | 18 | 16 | 16 | 14 | |
| 5 | 8 | 10 | 12 | 13 | 12 | 14 | 15 | 18 | 16 | 16 | 15 | |
| 6 | 8 | 10 | 12 | 14 | 13 | 14 | 15 | 18 | 16 | 16 | 15 | |
| 7 | 8 | 10 | 12 | 14 | 13 | 14 | 15 | 20 | 16 | 16 | 15 | |
| 8 | 8 | 11 | 12 | 14 | 14 | 14 | 18 | 20 | 16 | 16 | 15 | |
| 9 | 8 | 11 | 12 | 14 | 14 | 14 | 18 | 20 | 16 | 16 | 16 | |
| 10 | 8 | 11 | 12 | 14 | 15 | 14 | 18 | 20 | 16 | 16 | 18 | |
| 11 | 8 | 11 | 12 | 17 | 15 | 14 | 18 | 20 | 16 | 16 | 18 | |
| 12 | 8 | 11 | 12 | 17 | 15 | 14 | 18 | 20 | 16 | 19 | 18 | |
| 13 | 8 | 11 | 12 | 17 | 15 | 15 | 18 | 20 | 16 | 19 | 18 | |
| 14 | 8 | 11 | 12 | 17 | 15 | 15 | 18 | 20 | 16 | 19 | 18 | |
| 15 | 8 | 11 | 14 | 17 | 15 | 15 | 18 | 20 | 16 | 19 | 18 | |
| 16 | 8 | 11 | 14 | 17 | 15 | 15 | 18 | 20 | 16 | 19 | 18 | |
| 17 | 9 | 11 | 14 | 17 | 15 | 15 | 18 | 20 | 16 | 19 | 18 | Two symbol error detection |
| 18 | 9 | 11 | 14 | 17 | 15 | 15 | 18 | 20 | 16 | 19 | 18 | |
| 19 | 9 | 11 | 14 | 17 | 15 | 15 | 18 | 20 | 16 | 19 | 18 | |
| 20 | 9 | 11 | 14 | 17 | 15 | 15 | 18 | 20 | 16 | 19 | 18 | |
| 21 | 9 | 11 | 14 | 17 | 15 | 16 | 18 | 20 | 16 | 19 | 18 | |
| 22 | 9 | 11 | 14 | 17 | 15 | 16 | 18 | 20 | 16 | 19 | 18 | |
| 23 | 9 | 11 | 14 | 17 | 15 | 16 | 18 | 20 | 16 | 19 | 18 | |
| 24 | 9 | 11 | 14 | 17 | 15 | 16 | 18 | 20 | 16 | 19 | 18 | |
| 25 | 9 | 11 | 14 | 17 | 15 | 16 | 18 | 20 | 16 | 19 | 18 | |
| 26 | 9 | 11 | 14 | 17 | 15 | 16 | 18 | 20 | 16 | 19 | 18 | |
| 27 | 9 | 11 | 14 | 17 | 15 | 16 | 18 | 20 | 17 | 19 | 18 | |
| 28 | 9 | 11 | 14 | 17 | 15 | 16 | 18 | 20 | 17 | 19 | 18 | |
| 29 | 9 | 11 | 14 | 17 | 15 | 16 | 18 | 20 | 17 | 19 | 18 | |
| 30 | 9 | 11 | 14 | 17 | 15 | 16 | 18 | 20 | 17 | 19 | 18 | |
| 31 | 9 | 11 | 14 | 17 | 15 | 16 | 18 | 20 | 17 | 19 | 18 | |
| 32 | 9 | 11 | 14 | 17 | 15 | 16 | 18 | 20 | 17 | 19 | 18 | |

*FIG. 17*

ERROR DETECTION CONSTANTS OF SYMBOL TRANSITION CLOCKING TRANSCODING

CROSS-REFERENCE TO RELATED APPLICATIONS

This application claims priority to and the benefit of U.S. provisional patent application No. 62/236,522 filed Oct. 2, 2015, U.S. provisional patent application No. 62/216,692 filed Sep. 10, 2015, and U.S. provisional patent application No. 62/084,998 filed Nov. 26, 2014, the entire content of these applications being incorporated herein by reference.

BACKGROUND

Field

The present disclosure pertains to enabling efficient operations over data communication interfaces and, more particularly, facilitating error detection in data communication interfaces that employ symbol transition clocking transcoding.

Background

Data communication interfaces may employ symbol transition clocking transcoding to embed clock information in sequences of symbols that encode data to be transmitted over an interface that has multiple signal wires, thereby obviating the need for dedicated clock signal wires.

In certain examples of multi-signal data transfer, multi-wire differential signaling such as N-factorial (N!) low-voltage differential signaling (LVDS), transcoding (e.g., the digital-to-digital data conversion of one encoding type to another) may be performed to embed symbol clock information by causing symbol transition at every symbol cycle, instead of sending clock information in separate data lanes (differential transmission paths). Embedding clock information by such transcoding can also minimize skew between clock and data signals, as well as to eliminate the need for a phase-locked loop (PLL) to recover the clock information from the data signals. In one example, a two-wire serial bus operated in accordance with conventional Inter-Integrated Circuit (I2C) protocols or camera control interface (CCI) protocols can be adapted to provide a CCI extension (CCIe) bus, which uses symbol transition clocking transcoding. The CCIe bus supports support a higher bit rate than an I2C bus or a CCI bus.

Error detection can be problematic in data transfer interfaces that employ transition encoding because there is typically no direct association between a signaling state error and errors in data decoded from the data transfer interface. The disassociation between data bits and signaling state can render conventional error detection techniques ineffective when applied to transition encoding interfaces.

It would be desirable to provide reliable error detection in transmissions between devices that use symbol transition clocking transcoding to communicate.

SUMMARY

According to certain aspects disclosed herein, multiple symbol errors can be detected in transmissions over a transition-encoded multi-wire interface. In one example, data to be communicated over the transition-encoded multi-wire interface may be converted into a transition number, and digits of the transition number may be converted into a sequence of symbols for transmission on a plurality of wires or connectors. The transition number may be expressed using a numeral system based on a maximum number of possible symbol transitions. In some instances, the total number of states per symbol available for encoding data transmissions on the plurality of connectors is at least one less than the total number of states per symbol available for encoding data transmissions on the plurality of connectors.

Symbols errors may be detected using an error detection constant (EDC), which may be configured as a predetermined number of least significant bits in a plurality of bits that also includes a data word. The predetermined number of least significant bits may be determined or calculated based on a total number of states per symbol available for encoding data transmissions on the plurality of wires or connectors. A symbol error affecting one or more symbols in the sequence of symbols may cause a decoded version of the EDC to have value that is different from a predefined value of the EDC that was appended to the data word at the transmitter.

According to certain aspects, a transmitting device may include a communications transceiver coupled to a plurality of connectors, error detection logic configured to provide a data word having an EDC appended thereto, an encoder configured to convert the data word into a transition number and to generate a sequence of symbols from the transition number, and a transmitter circuit configured to transmit the sequence of symbols on the plurality of connectors. The EDC may have a predefined value and a fixed length. The EDC may be modified when one or more symbols in the sequence of symbols are modified during transmission.

In an aspect, each symbol may be generated using a digit of the transition number and a preceding symbol. Clock information may be embedded in transitions between consecutive symbols in the sequence of symbols.

In an aspect, the EDC may be appended as a predefined number of least significant bits, the predefined number of least significant bits being determined based on a total number of states per symbol available for encoding data transmissions on the plurality of connectors. The predefined number of least significant bits may be determined based on a total number of symbols used to encode the data word. The plurality of connectors may include a number (N) of single-ended connectors. The plurality of connectors may include N connectors that carry multi-level differential signals. In one example, the total number of states per symbol available for encoding data transmissions is $2^N-x$, where x is at least 1. In another example, the total number of states per symbol available for encoding data transmissions is $N!-x$, where x is at least 1.

In an aspect, the total number of states available at each transition may be 3. The EDC may include 8 bits in a first example. The sequence of symbols may include 17 or more symbols, and the EDC may include 9 bits in a second example. In a third example, where the total number of states available at each transition is 5, the EDC may include 10 bits. In a fourth example, where the total number of states available at each transition is 5 and the sequence of symbols includes 8 or more symbols, the EDC may include 11 bits.

According to certain aspects a method of transmitting data on a multi-wire interface includes providing a plurality of bits to be transmitted over a plurality of connectors, where the plurality of bits includes an EDC that has a predefined value and a fixed length. The EDC may be used for error detection. The method may include converting the plurality of bits into a transition number, converting the transition number into a sequence of symbols, and transmitting the sequence of symbols on the plurality of connectors. The transition number may be expressed using a numeral system based on a maximum number of possible states per symbol.

The EDC may be modified when one or more symbols in the sequence of symbols are modified during transmission.

In an aspect, a clock is embedded in transitions between symbols in the sequence of symbols.

In an aspect, a transmission error affecting the one or more symbols in the sequence of symbols may result in the EDC having a value different from the predefined value when decoded at a receiver.

In an aspect, the EDC is provided as a predefined number of least significant bits, the predefined number of least significant bits being determined based on a total number of states per symbol available for encoding data transmissions on the plurality of connectors. In a first example, a total number of states available at each transition may be 3 and the EDC may include 8 bits. In a second example, a total number of states available at each transition may be 3, the sequence of symbols may include 17 or more symbols, and the EDC may include 9 bits. In a third example, a total number of states available at each transition may be 5 and the EDC may include 10 bits.

According to certain aspects, a computer readable storage medium has instructions stored thereon. The storage medium may include transitory or non-transitory storage media. The instructions may be executed by a processor such that the processor is caused to provide a plurality of bits to be transmitted over a plurality of connectors, where the plurality of bits includes an EDC that has a predefined value and a fixed length. The EDC may be used for error detection. The instructions may cause the processor to convert the plurality of bits into a transition number, convert the transition number into a sequence of symbols, and transmit the sequence of symbols on the plurality of connectors. The transition number may be expressed using a numeral system based on a maximum number of possible states per symbol. The EDC may be modified when one or more symbols in the sequence of symbols are modified during transmission.

In an aspect, a clock is embedded in transitions between symbols in the sequence of symbols.

In an aspect, a transmission error affecting the one or more symbols in the sequence of symbols may result in the EDC having a value different from the predefined value when decoded at a receiver.

In an aspect, the EDC is provided as a predefined number of least significant bits, the predefined number of least significant bits being determined based on a total number of states per symbol available for encoding data transmissions on the plurality of connectors. In a first example, a total number of states available at each transition may be 3 and the EDC may include 8 bits. In a second example, a total number of states available at each transition may be 3, the sequence of symbols includes 17 or more symbols, and the EDC may include 9 bits. In a third example, a total number of states available at each transition may be 5 and the EDC may include 10 bits.

According to certain aspects, an apparatus includes means for providing a plurality of bits to be transmitted over a plurality of connectors, where the plurality of bits includes an EDC that has a predefined value and a fixed length, where the EDC is used for error detection. The apparatus may include means for converting the plurality of bits into a transition number, means for converting the transition number into a sequence of symbols, and means for transmitting the sequence of symbols on the plurality of connectors. The transition number may be expressed using a numeral system based on a maximum number of possible states per symbol. The EDC may be modified when one or two symbols in the sequence of symbols are modified during transmission.

In an aspect, a clock is embedded in transitions between symbols in the sequence of symbols.

In an aspect, a transmission error affecting the one or two symbols in the sequence of symbols may result in the EDC having a value different from the predefined value when decoded at a receiver.

In an aspect, the EDC is provided as a predefined number of least significant bits, the predefined number of least significant bits being determined based on a total number of states per symbol available for encoding data transmissions on the plurality of connectors. In a first example, a total number of states available at each transition may be 3 and the EDC may include 8 bits. In a second example, a total number of states available at each transition may be 3, the sequence of symbols includes 17 or more symbols, and the EDC may include 9 bits. In a third example, a total number of states available at each transition may be 5 and the EDC may include 10 bits.

According to certain aspects, a method of receiving data from a multi-wire interface includes receiving a sequence of symbols from a plurality of connectors, converting the sequence of symbols into a transition number, each digit of the transition number representing a transition between two consecutive symbols transmitted on the plurality of connectors, converting the transition number into a plurality of bits, and determining whether one or two symbol errors have occurred during transmission of the sequence of symbols based on a value of an EDC included in the plurality of bits. The EDC may have been transmitted as a predefined value and a fixed length determined based on a total number of states per symbol defined for encoding data transmissions on the plurality of connectors.

In an aspect, a clock is embedded in transitions between symbols in the sequence of symbols.

In an aspect, the transition number may be expressed using a numeral system based on a maximum number of possible symbol transitions between a pair of consecutive symbols transmitted on the plurality of connectors.

In an aspect, the one or two symbol errors may cause a decoded version of the EDC to have a value that is different from the predefined value.

In an aspect, the EDC may be provided as a predefined number of least significant bits in the plurality of bits. The predefined number of least significant bits may be determined based on a total number of states per symbol available for encoding data transmissions on the plurality of connectors. The predefined number of least significant bits may be determined or calculated based on a total number of symbols used to encode the plurality of bits. The plurality of connectors may include N single-ended connectors. The plurality of connectors may include N connectors that carry multi-level differential signals. In a first example, the total number of states per symbol available for encoding data transmissions is $2^N-x$, where x is at least 1. In a second example, the total number of states per symbol available for encoding data transmissions is $N!-x$, where x is at least 1.

In a third example, where the total number of states number available at each transition is 3, the EDC may include 8 bits. In a fourth example, where the total number of states number available at each transition is 3 and the sequence of symbols includes 17 or more symbols, the EDC may include 9 bits. In a fifth example, where the total number of states number available at each transition is 5, the EDC may include 10 bits. In a sixth example, where the total number of states number available at each transition is 5 and the sequence of symbols includes 8 or more symbols, the EDC may include 11 bits.

According to certain aspects, an apparatus includes means for receiving a sequence of symbols from a plurality of connectors, means for converting the sequence of symbols into a transition number, each digit of the transition number representing a transition between two consecutive symbols transmitted on the plurality of connectors, means for converting the transition number into a plurality of bits, and means for determining whether one or two symbol errors have occurred during transmission of the sequence of symbols based on a value of an EDC included in the plurality of bits. The EDC may have been transmitted as a predefined value and a fixed length determined based on a total number of states per symbol defined for encoding data transmissions on the plurality of connectors.

In an aspect, a clock is embedded in transitions between symbols in the sequence of symbols.

In an aspect, the transition number may be expressed using a numeral system based on a maximum number of possible symbol transitions between a pair of consecutive symbols transmitted on the plurality of connectors.

In an aspect, the one or two symbol errors may cause a decoded version of the EDC to have a value that is different from the predefined value.

In an aspect, the EDC may be provided as a predefined number of least significant bits in the plurality of bits. The predefined number of least significant bits may be determined based on a total number of states per symbol available for encoding data transmissions on the plurality of connectors. The predefined number of least significant bits may be calculated or otherwise determined based on a total number of symbols used to encode the plurality of bits. The plurality of connectors may include N single-ended connectors. The plurality of connectors may include N connectors that carry multi-level differential signals. In a first example, the total number of states per symbol available for encoding data transmissions is $2^N-x$, where x is at least 1. In a second example, the total number of states per symbol available for encoding data transmissions is N!-x, where x is at least 1.

In a third example, where the total number of states number available at each transition is 3, the EDC may include 8 bits. In a fourth example, where the total number of states number available at each transition is 3 and the sequence of symbols includes 17 or more symbols, the EDC may include 9 bits. In a fifth example, where the total number of states number available at each transition is 5, the EDC may include 10 bits. In a sixth example, where the total number of states number available at each transition is 5 and the sequence of symbols includes 8 or more symbols, the EDC may include 11 bits.

According to certain aspects, a computer readable storage medium has instructions stored thereon. The storage medium may include transitory or non-transitory storage media. The instructions may be executed by a processor such that the processor is caused to receive a sequence of symbols from a plurality of connectors, convert the sequence of symbols into a transition number, each digit of the transition number representing a transition between two consecutive symbols transmitted on the plurality of connectors, convert the transition number into a plurality of bits, and determine whether one or more symbol errors have occurred during transmission of the sequence of symbols based on a value of an EDC included in the plurality of bits. The EDC may have been transmitted as a predefined value and a fixed length determined based on a total number of states per symbol defined for encoding data transmissions on the plurality of connectors.

In an aspect, a clock is embedded in transitions between symbols in the sequence of symbols.

In an aspect, the transition number may be expressed using a numeral system based on a maximum number of possible symbol transitions between a pair of consecutive symbols transmitted on the plurality of connectors.

In an aspect, the one or two symbol errors may cause a decoded version of the EDC to have a value that is different from the predefined value.

In an aspect, the EDC may be provided as a predefined number of least significant bits in the plurality of bits. The predefined number of least significant bits may be calculated or otherwise determined based on a total number of states per symbol available for encoding data transmissions on the plurality of connectors. The predefined number of least significant bits may be determined based on a total number of symbols used to encode the plurality of bits. The plurality of connectors may include N single-ended connectors. The plurality of connectors may include N connectors that carry multi-level differential signals. In a first example, the total number of states per symbol available for encoding data transmissions is $2^N-x$, where x is at least 1. In a second example, the total number of states per symbol available for encoding data transmissions is N!-x, where x is at least 1.

In a third example, where the total number of states number available at each transition is 3, the EDC may include 8 bits. In a fourth example, where the total number of states number available at each transition is 3 and the sequence of symbols includes 17 or more symbols, the EDC may include 9 bits. In a fifth example, where the total number of states number available at each transition is 5, the EDC may include 10 bits. In a sixth example, where the total number of states number available at each transition is 5 and the sequence of symbols includes 8 or more symbols, the EDC may include 11 bits.

According to certain aspects, a device includes a communications transceiver coupled to a plurality of connectors, a receiver circuit configured to receive a sequence of symbols on the plurality of connectors, and a decoder configured to convert a transition number into a first data word, the transition number being representative of transitions between consecutive symbols in the sequence of symbols. The first data word may include a predetermined number of least significant bits that are provided for detecting one or two symbol transmission errors associated with transmission of the sequence of symbols.

In an aspect, a clock may be embedded in transitions between symbols in the sequence of symbols.

In an aspect, the transition number may be expressed using a numeral system based on a maximum number of possible symbol transitions between a pair of consecutive symbols transmitted on the plurality of connectors.

In an aspect, the one or two symbol errors may cause a decoded version of the EDC to have a value that is different from the predefined value.

In an aspect, the EDC may be provided as a predefined number of least significant bits in the plurality of bits. The predefined number of least significant bits may be calculated or determined based on a total number of states per symbol available for encoding data transmissions on the plurality of connectors. The predefined number of least significant bits may be determined based on a total number of symbols used to encode the plurality of bits. The plurality of connectors may include N single-ended connectors. The plurality of connectors may include N connectors that carry multi-level differential signals. In a first example, the total number of states per symbol available for encoding data transmissions is $2^N$−x, where x is at least 1. In a second example, the total number of states per symbol available for encoding data transmissions is N!−x, where x is at least 1.

In a third example, where the total number of states number available at each transition is 3, the EDC may include 8 bits. In a fourth example, where the total number of states number available at each transition is 3 and the sequence of symbols includes 17 or more symbols, the EDC may include 9 bits. In a fifth example, where the total number of states number available at each transition is 5, the EDC may include 10 bits. In a sixth example, where the total number of states number available at each transition is 5 and the sequence of symbols includes 8 or more symbols, the EDC may include 11 bits.

DRAWINGS

Various features, nature, and advantages may become apparent from the detailed description set forth below when taken in conjunction with the drawings in which like reference characters identify correspondingly throughout.

FIG. 11 tabulates values of $r^n$, where n lies in the range 0-15, and when r=3 and r=5.

Figure 12:
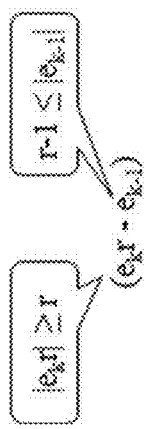

FIG. 12 tabulates error coefficients corresponding to a single symbol error in a sequence of symbols.

FIG. 13 illustrates the longest non-zero LSB portion in an error coefficient.

Figure 14:
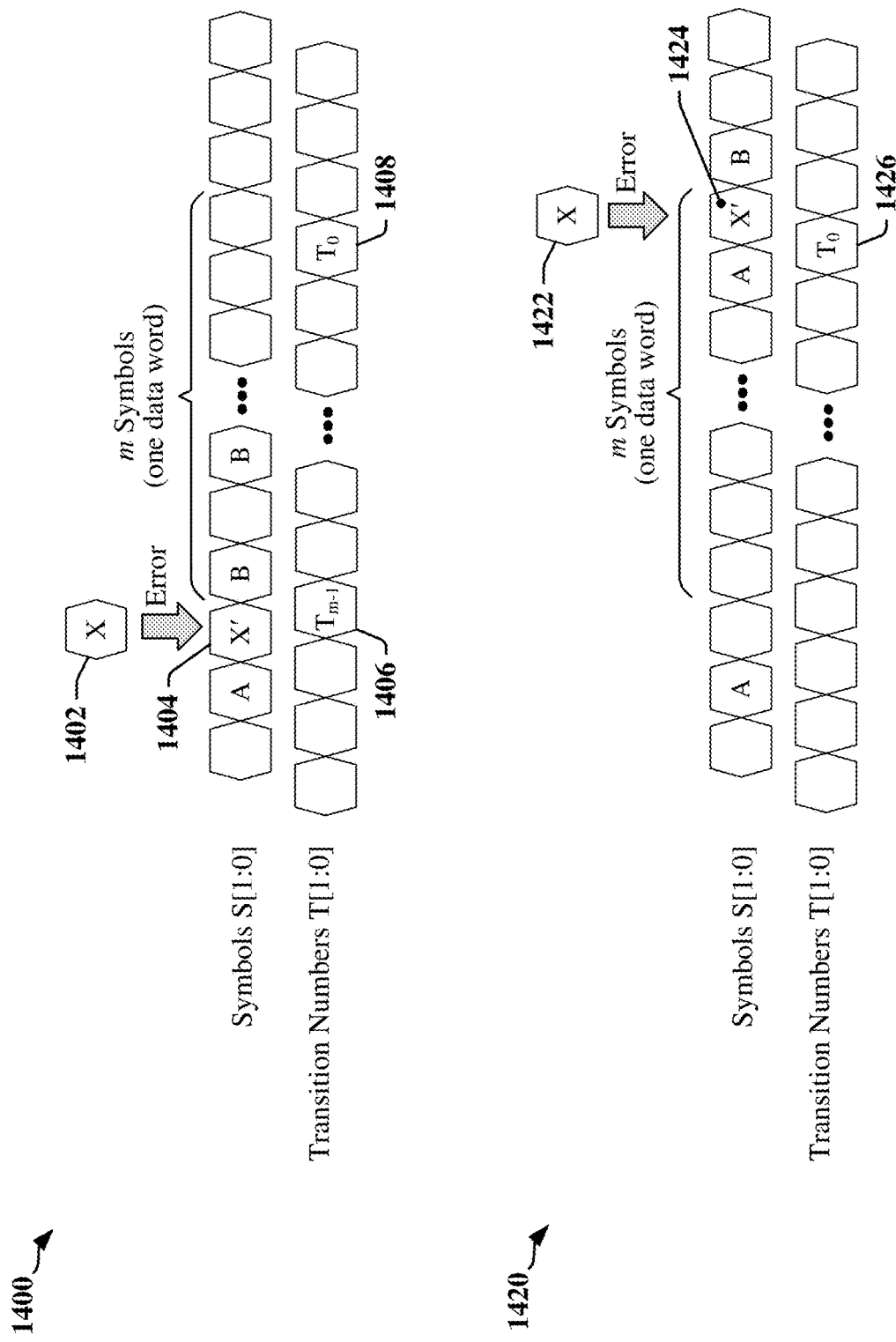

FIG. 14 illustrates cases in which a single symbol error results in an error in a single transition number.

Figure 15:
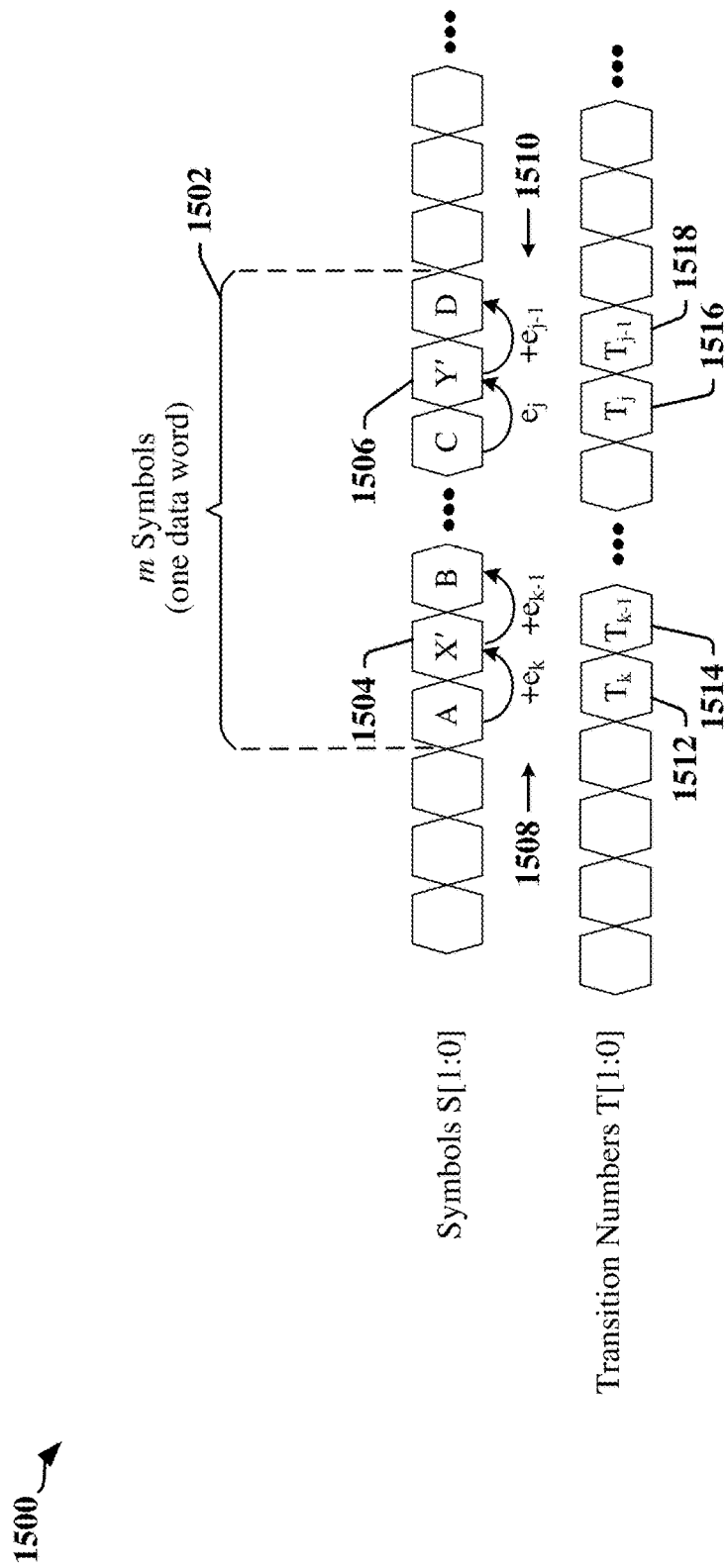

FIG. 15 illustrates a first example of signaling errors affecting two symbols in a sequence of symbols transmitted over a single multi-wire communication interface.

Figure 16:
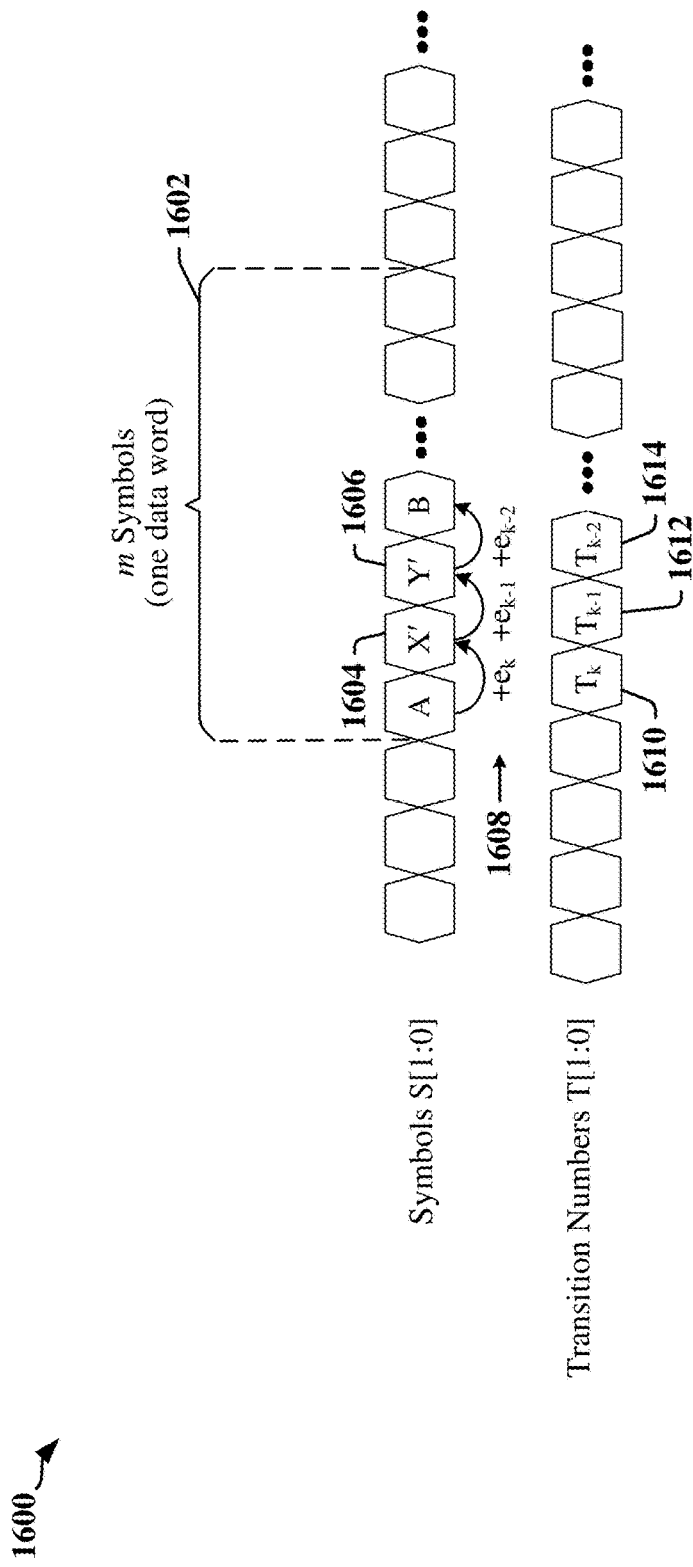

FIG. 16 illustrates a second example of signaling errors that affect two consecutive symbols transmitted over a multi-wire communication interface.

FIG. 17 illustrates the number of bits provided in an EDC for detection of two symbol errors in a sequence of symbols that encodes a word in accordance with certain aspects disclosed herein.

Figure 18:
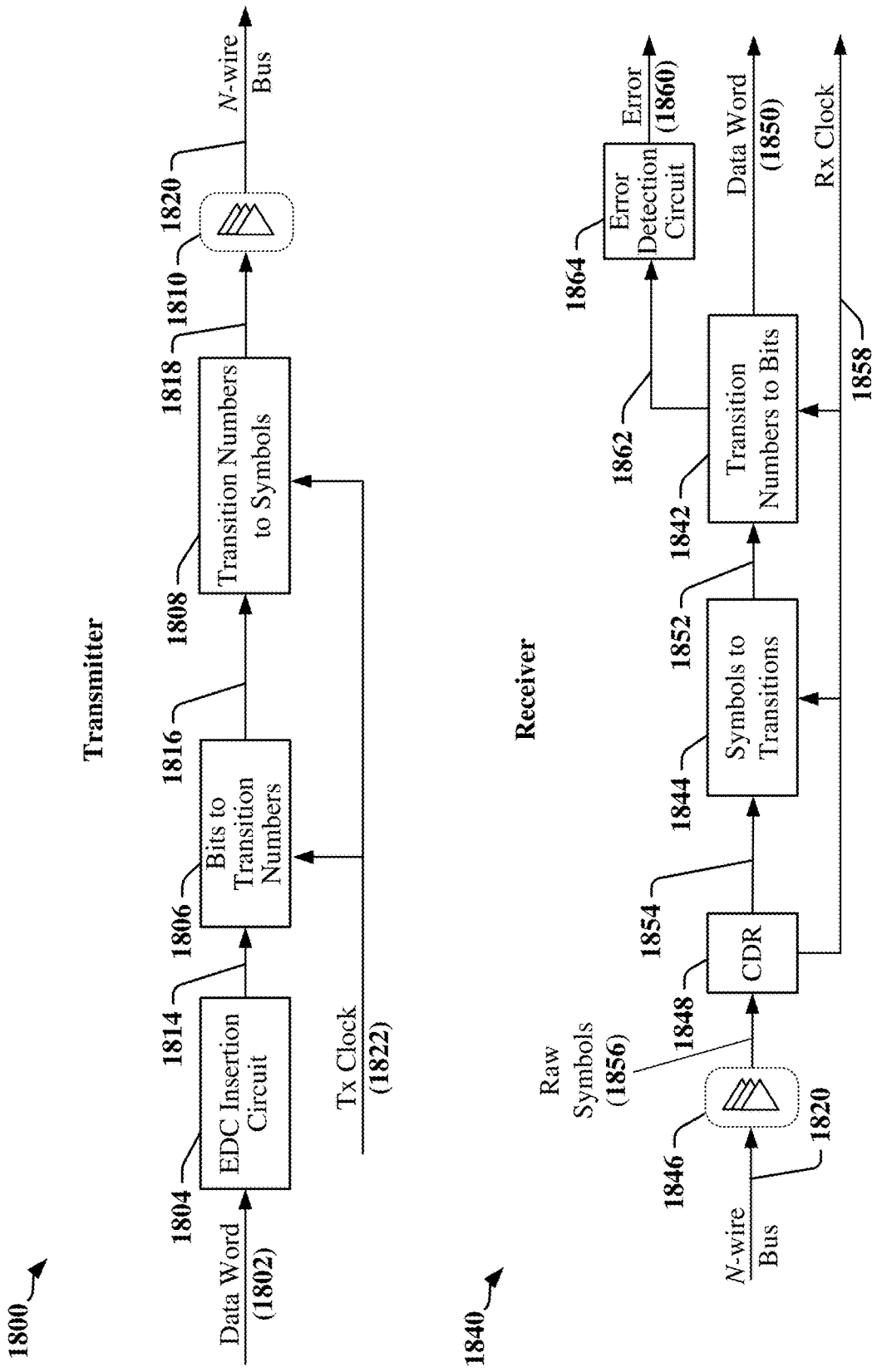

FIG. 18 illustrates a transmitter and a receiver adapted to provide error detection in accordance with certain aspects disclosed herein.

Figure 19:
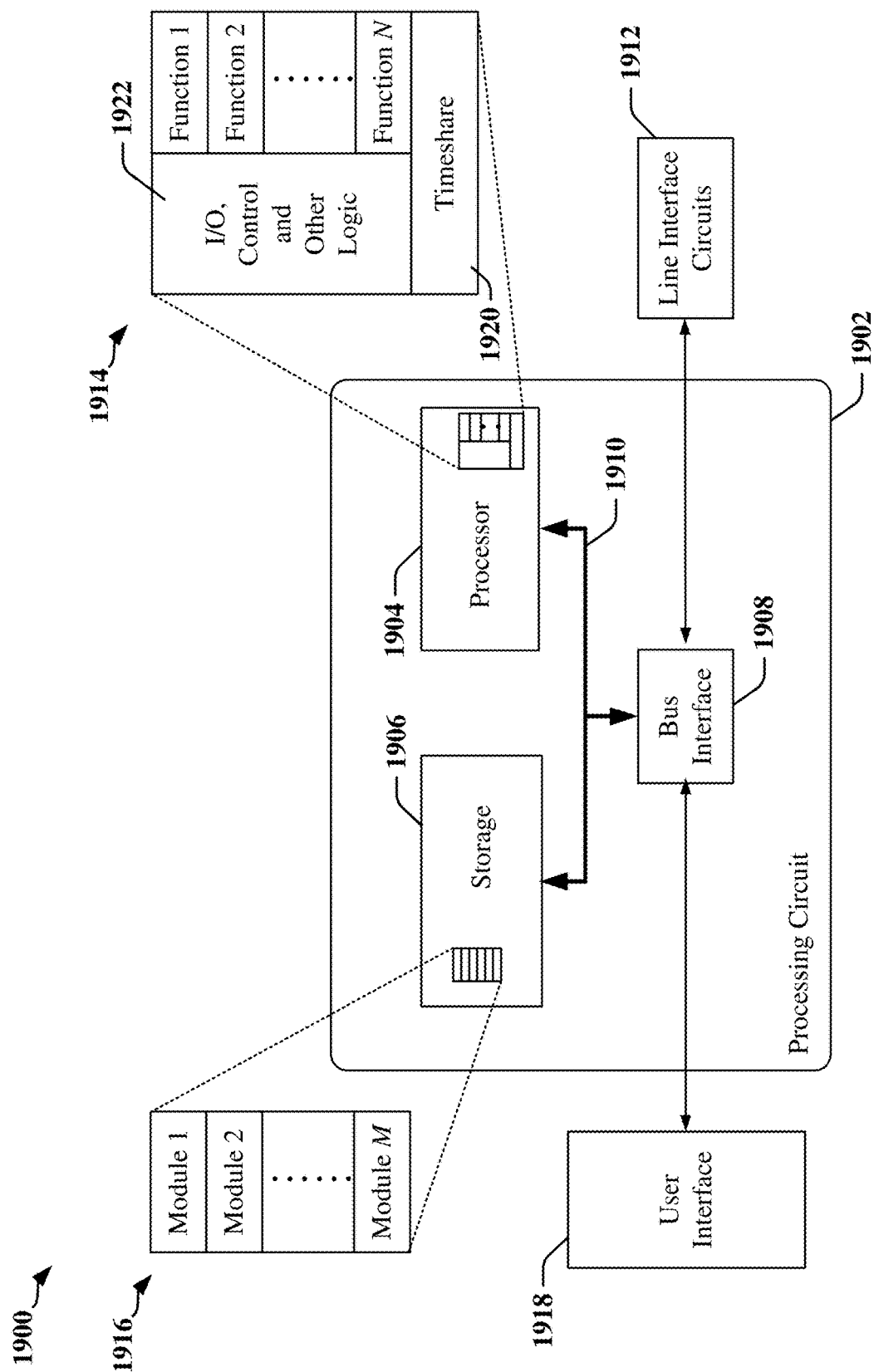

FIG. 19 is a block diagram illustrating an example of an apparatus employing a processing system that may be adapted according to certain aspects disclosed herein.

Figure 20:
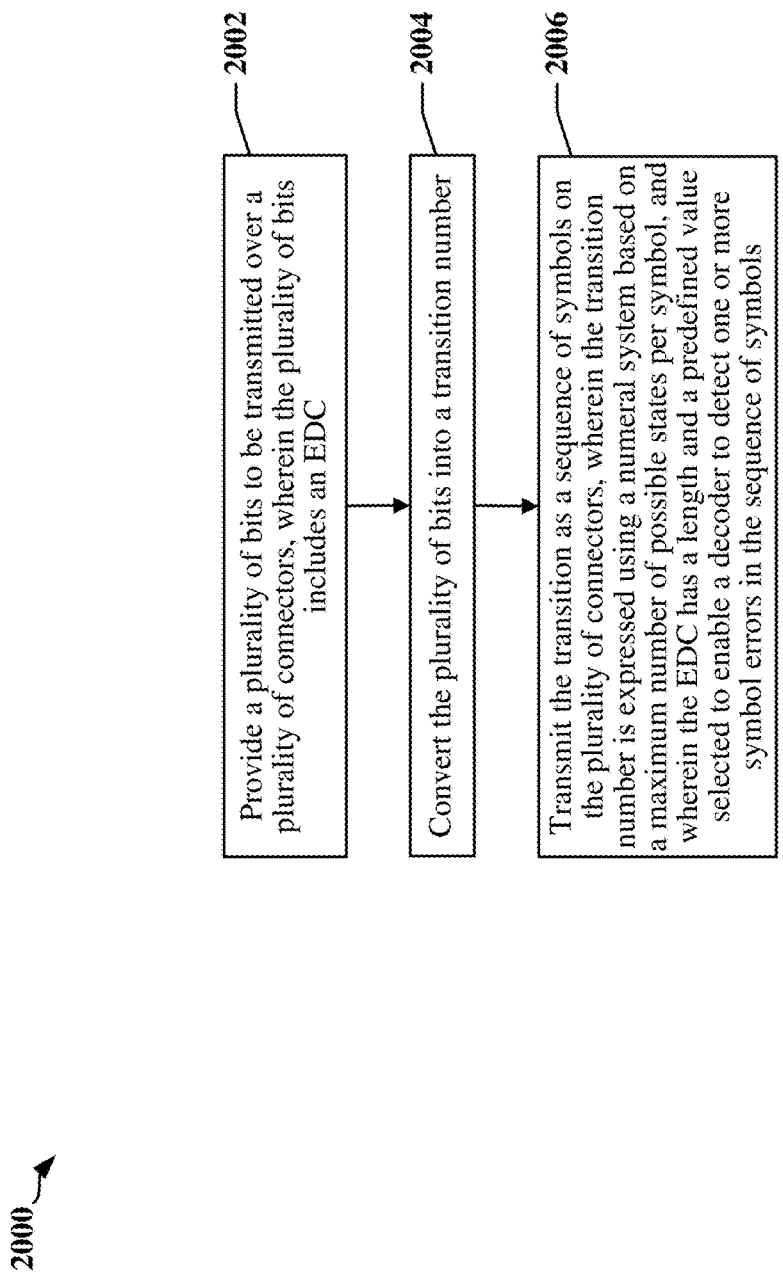

FIG. 20 is a flow chart of a data communications method that may be employed at a transmitter in accordance with certain aspects disclosed herein.

Figure 21:
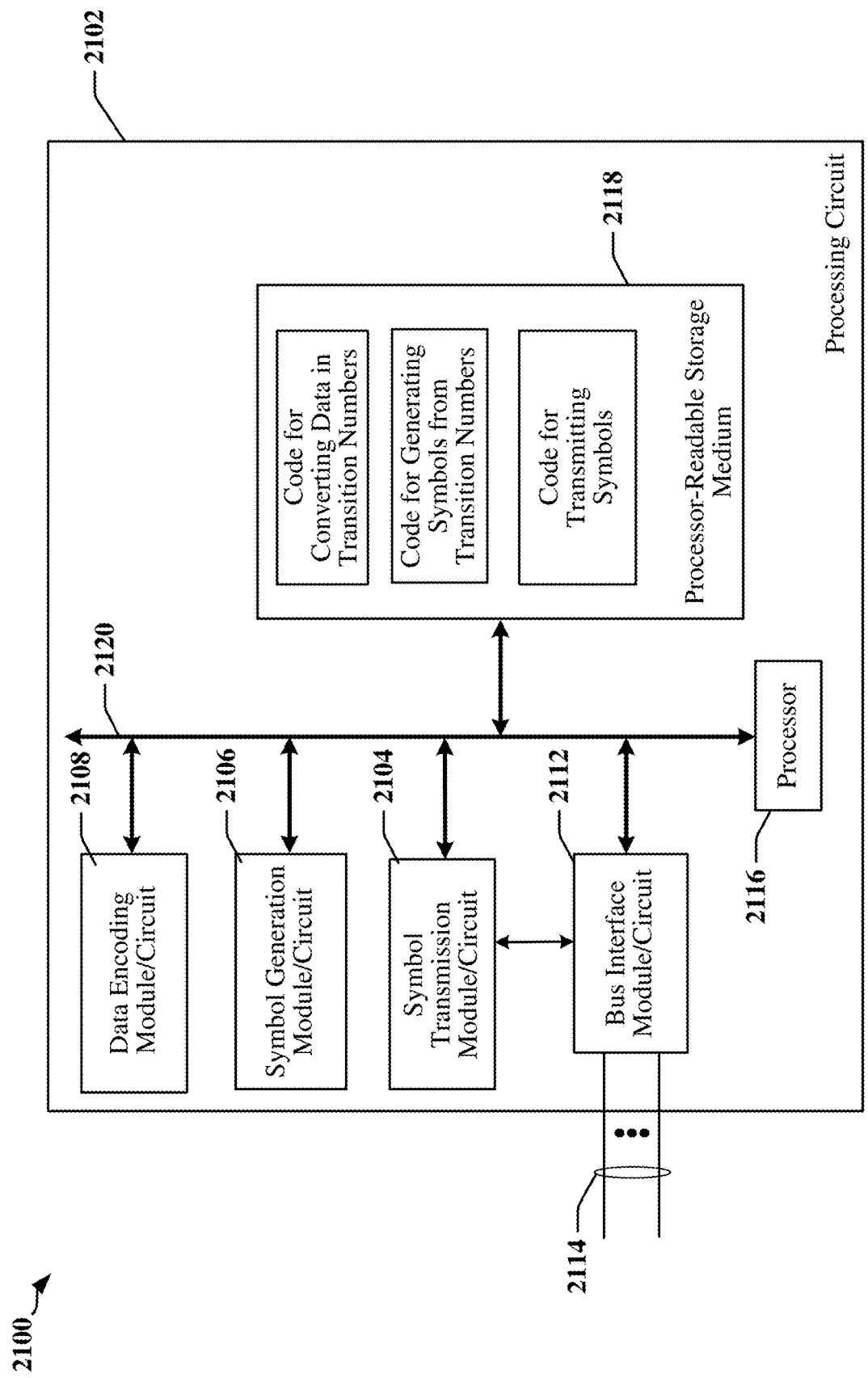

FIG. 21 is a diagram illustrating a first example of a hardware implementation for an apparatus used in an interface that provides symbol error detection according to certain aspects disclosed herein.

Figure 22:
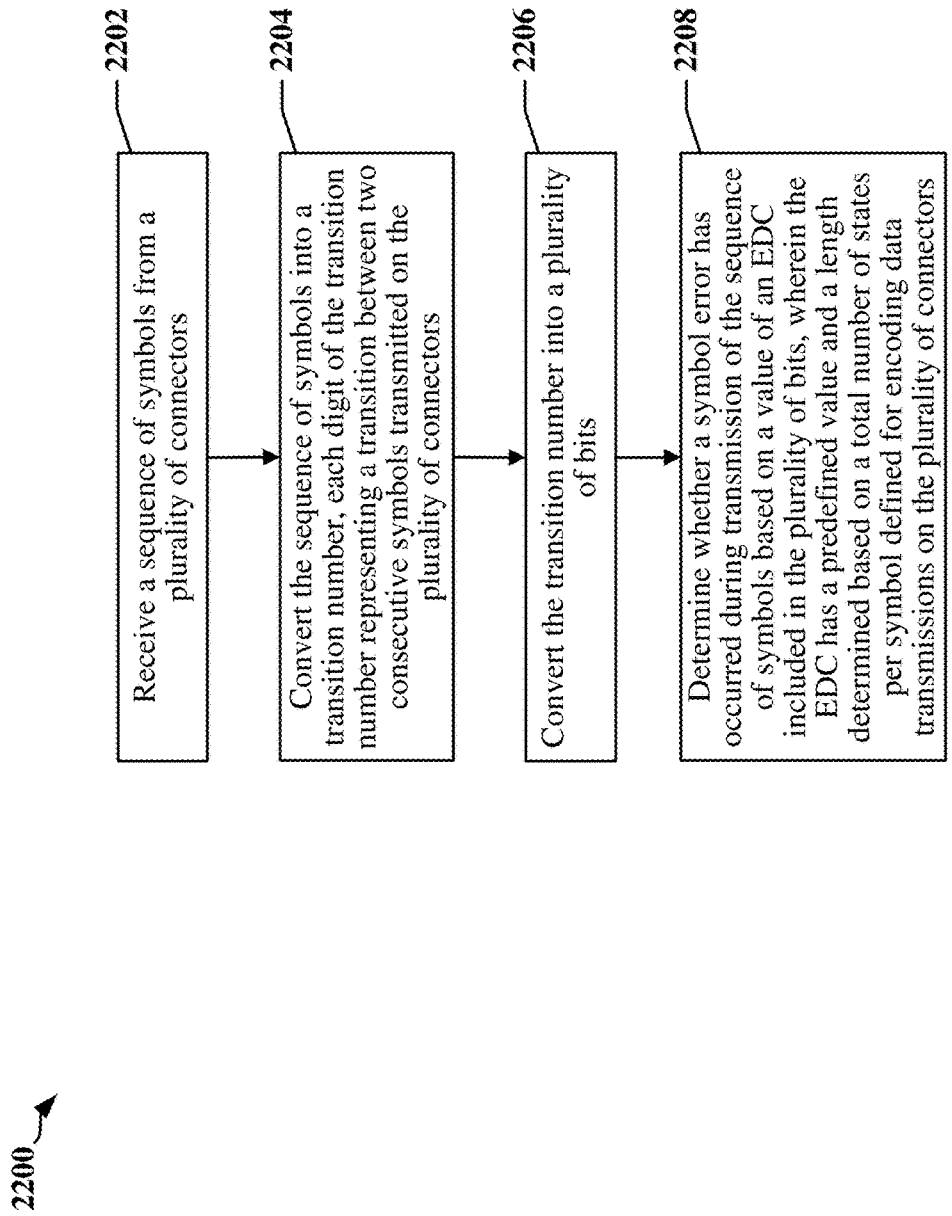

FIG. 22 is a flow chart of a data communications method that may be employed at a receiver in accordance with certain aspects disclosed herein.

Figure 23:
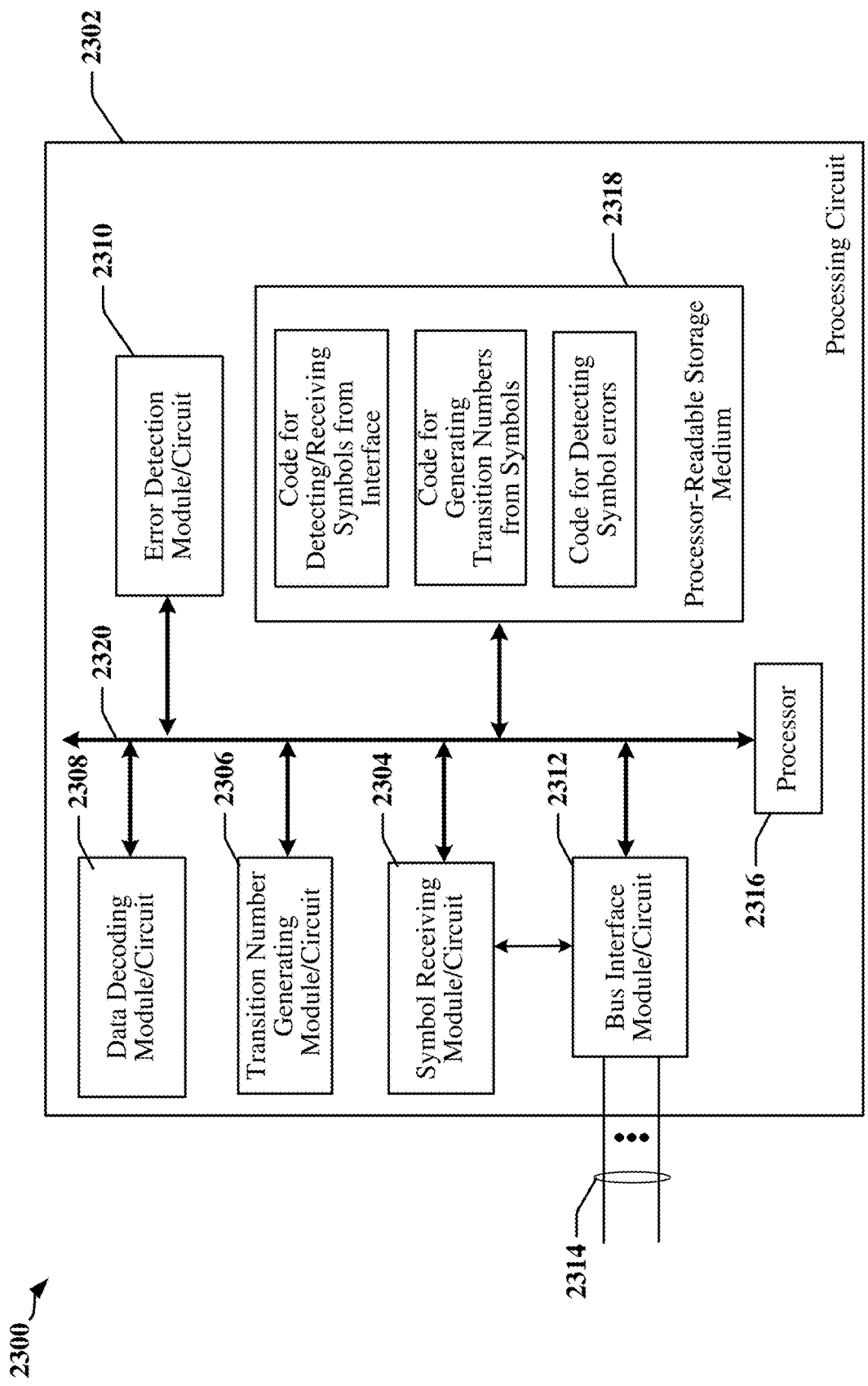

FIG. 23 is a diagram illustrating a second example of a hardware implementation for an apparatus used in an interface that provides symbol error detection according to certain aspects disclosed herein.

DETAILED DESCRIPTION

In the following description, specific details are given to provide a thorough understanding of the embodiments. However, it will be understood by one of ordinary skill in the art that the embodiments may be practiced without these specific detail. For example, circuits may be shown in block diagrams in order not to obscure the embodiments in unnecessary detail. In other instances, well-known circuits, structures, and techniques may not be shown in detail in order not to obscure the embodiments.

Overview

Certain data transfer interfaces employ transition encoding, including 3-phase and N! multi-wire LVDS interfaces, and multi-wire single-ended interfaces including the CCIe interface. Transition encoding embeds clock information in signaling states transmitted over the interface. In certain instances, data is transcoded to transition numbers, where each transition number selects a next symbol to be transmitted after a current symbol. Each symbol may represent signaling state of the interface. For example, the transition number may represent an offset used to select between symbols in an ordered set of symbols that can be transmitted on the interface. By ensuring that consecutive symbols are different from one another, a change in signaling state of the interface occurs at each symbol boundary providing information used to generate a receive clock at the receiver.

Errors in signaling state that change a transmitted symbol $S_1$ to a received symbol $Se_1$ can cause a receiver to produce an incorrect transition number $T_1+e_1$ associated with the transition between an immediately preceding symbol $S_2$ and the changed symbol $Se_1$. $T_1$ represents the difference between $S_2$ and the correctly transmitted symbol $S_1$, and $e_1$ is the value of an offset introduced by the signaling error. A second incorrect transition number $T_0+e_0$ is associated with the changed symbol $Se_1$, where $T_0$ represents the difference between the correctly transmitted symbol $S_1$ and a next symbol $S_0$, with $e_1$ representing the value of the offset introduced by the signaling error. The values of $e_1$ and $e_0$ do not directly correspond to the error in signaling state, and the disassociation between data bit errors and signaling state errors can render conventional error detection techniques ineffective when applied to transition encoding interfaces.

According to certain aspects disclosed herein, reliable error detection is enabled in transition-encoded interfaces by providing an error detection constant (EDC). The EDC may include a predefined number of bits having a known, fixed value. The value of the EDC may have a zero value, in one example, and may be provided as the least significant bits (LSBs) of each word to be transmitted on the interface.

Example of a Device Employing Transition Encoding

Figure 1:
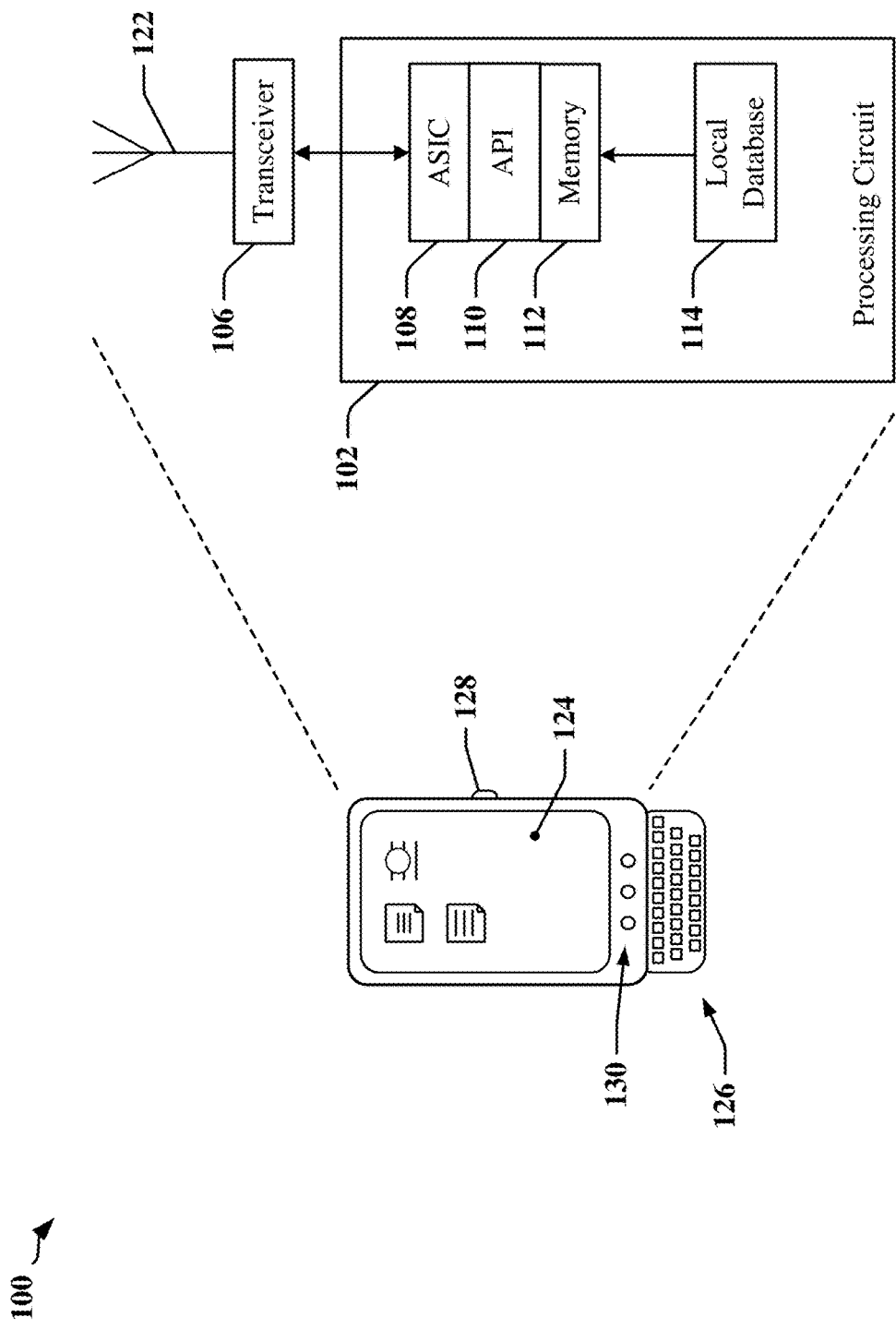
FIG. 1 depicts an apparatus employing a data link between IC devices that selectively operates according to one of a plurality of available standards.

FIG. 1 depicts one example of an apparatus 100 that employs a communication link between IC devices. In one example, the apparatus 100 may include a wireless communication device that communicates through an RF transceiver with a radio access network (RAN), a core access network, the Internet and/or another network. The apparatus 100 may include a communications transceiver 106 operably coupled to processing circuit 102. The processing circuit 102 may include one or more IC devices, such as an application-specific IC (ASIC) 108. The ASIC 108 may include one or more processing devices, logic circuits, and so on. The processing circuit 102 may include and/or be coupled to processor readable storage such as a memory device 112 that may maintain instructions and data that may be executed by processing circuit 102. The processing circuit 102 may be controlled by one or more of an operating system and an application programming interface (API) 110 layer that supports and enables execution of software modules residing in storage media, such as the memory device 112 of the wireless device. The memory device 112 may include read-only memory (ROM) or random-access memory (RAM), electrically erasable programmable ROM (EEPROM), flash cards, or any memory device that can be used in processing systems and computing platforms. The processing circuit 102 may include or access a local database 114 that can maintain operational parameters and other information used to configure and operate the apparatus 100. The local database 114 may be implemented using one or more of a database module, flash memory, magnetic media, EEPROM, optical media, tape, soft or hard disk, or the like. The processing circuit may also be operably coupled to external devices such as an antenna 122, a display 124, operator controls, such as button 128 and keypad 126 among other components.

Figure 2:
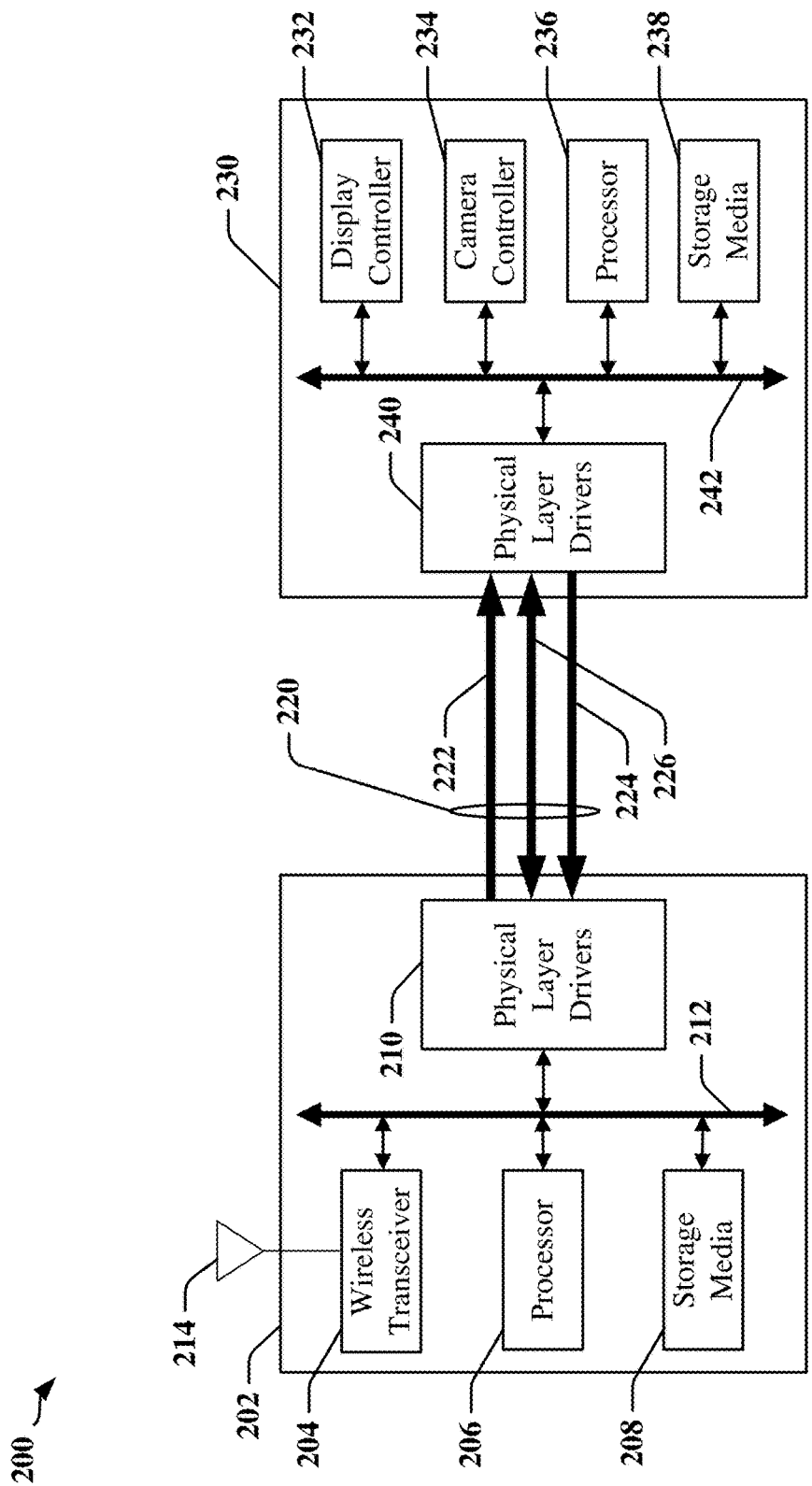
FIG. 2 illustrates a system architecture for an apparatus employing a data link between IC devices.

FIG. 2 is a block schematic drawing illustrating certain aspects of an apparatus 200 connected to a communication link 220, where the apparatus 200 may be embodied in one or more of a wireless mobile device, a mobile telephone, a mobile computing system, a wireless telephone, a notebook computer, a tablet computing device, a media player, s gaming device, or the like. The apparatus 200 may include a plurality of IC devices 202 and 230 that exchange data and control information through a communication link 220. The communication link 220 may be used to connect IC devices 202 and 230 that are located in close proximity to one another, or physically located in different parts of the apparatus 200. In one example, the communication link 220 may be provided on a chip carrier, substrate or circuit board that carries the IC devices 202 and 230. In another example, a first IC device 202 may be located in a keypad section of a flip-phone while a second IC device 230 may be located in a display section of the flip-phone. In another example, portion of the communication link 220 may include a cable or optical connection.

The communication link 220 may include multiple channels 222, 224 and 226. One or more channels 226 may be bidirectional, and may operate in half-duplex and/or full-duplex modes. One or more channels 222 and 224 may be unidirectional. The communication link 220 may be asymmetrical, providing higher bandwidth in one direction. In one example described herein, a first communication channel 222 may provide or be referred to as a forward link while a second communication channel 224 may provide or be referred to as a reverse link. The first IC device 202 may be designated as a host system or transmitter, while the second IC device 230 may be designated as a client system or receiver, even if both IC devices 202 and 230 are configured to transmit and receive on the communication channel 222. In one example, a forward link may operate at a higher data rate when communicating data from a first IC device 202 to a second IC device 230, while a reverse link may operate at a lower data rate when communicating data from the second IC device 230 to the first IC device 202.

The IC devices 202 and 230 may each have a processor 206, 236, and/or a processing and/or computing circuit, or other such device or circuit. In one example, the first IC device 202 may perform core functions of the apparatus 200, including maintaining wireless communications through a wireless transceiver 204 and an antenna 214, while the second IC device 230 may support a user interface that manages or operates a display controller 232. The first IC device 202 or second IC device 230 may control operations of a camera or video input device using a camera controller 234. Other features supported by one or more of the IC devices 202 and 230 may include a keyboard, a voice-recognition component, and other input or output devices. The display controller 232 may include circuits and software drivers that support displays such as a liquid crystal display (LCD) panel, touch-screen display, indicators and so on. The storage media 208 and 238 may include transitory and/or non-transitory storage devices adapted to maintain instructions and data used by respective processors 206 and 236, and/or other components of the IC devices 202 and 230. Communication between each processor 206, 236 and its corresponding storage media 208 and 238 and other modules and circuits may be facilitated by one or more bus 212 and 242, respectively.

The reverse link (here, the second communication channel 224) may be operated in the same manner as the forward link (here, the first communication channel 222), and the first communication channel 222 and second communication channel 224 may be capable of transmitting at comparable speeds or at different speeds, where speed may be expressed as data transfer rate and/or clocking rates. The forward and reverse data rates may be substantially the same or differ by orders of magnitude, depending on the application. In some applications, a single bidirectional link (here, the third communication channel 226) may support communications between the first IC device 202 and the second IC device 230. The first communication channel 222 and/or second communication channel 224 may be configurable to operate in a bidirectional mode when, for example, the forward and reverse links share the same physical connections and operate in a half-duplex manner. In one example, the communication link 220 may be operated to communicate control, command and other information between the first IC device 202 and the second IC device 230 in accordance with an industry or other standard.

In one example, forward and reverse links may be configured or adapted to support a wide video graphics array (WVGA) 80 frames per second LCD driver IC without a frame buffer, delivering pixel data at 810 Mbps for display refresh. In another example, forward and reverse links may be configured or adapted to enable communications between with dynamic random access memory (DRAM), such as double data rate synchronous dynamic random access memory (SDRAM). Encoding devices 210 and/or 230 can encode multiple bits per clock transition, and multiple sets of wires can be used to transmit and receive data from the SDRAM, control signals, address signals, and so on.

Forward and reverse channels may comply or be compatible with application-specific industry standards. In one example, the MIPI standard defines physical layer interfaces between an IC device 202 that includes an application processor and an IC device 230 that controls and/or supports the camera or display in a mobile device. The MIPI standard includes specifications that govern the operational characteristics of products that comply with MIPI specifications for mobile devices. The MIPI standard may define interfaces that employ complimentary metal-oxide-semiconductor (CMOS) parallel buses.

In one example, the communication link 220 of FIG. 2 may be implemented as a wired bus that includes a plurality of signal wires (denoted as N wires). The N wires may be configured to carry data encoded in symbols, where each symbol defines a signaling state of the N wires, and where clock information is embedded in a sequence of the symbols transmitted over the plurality of wires.

Figure 3:
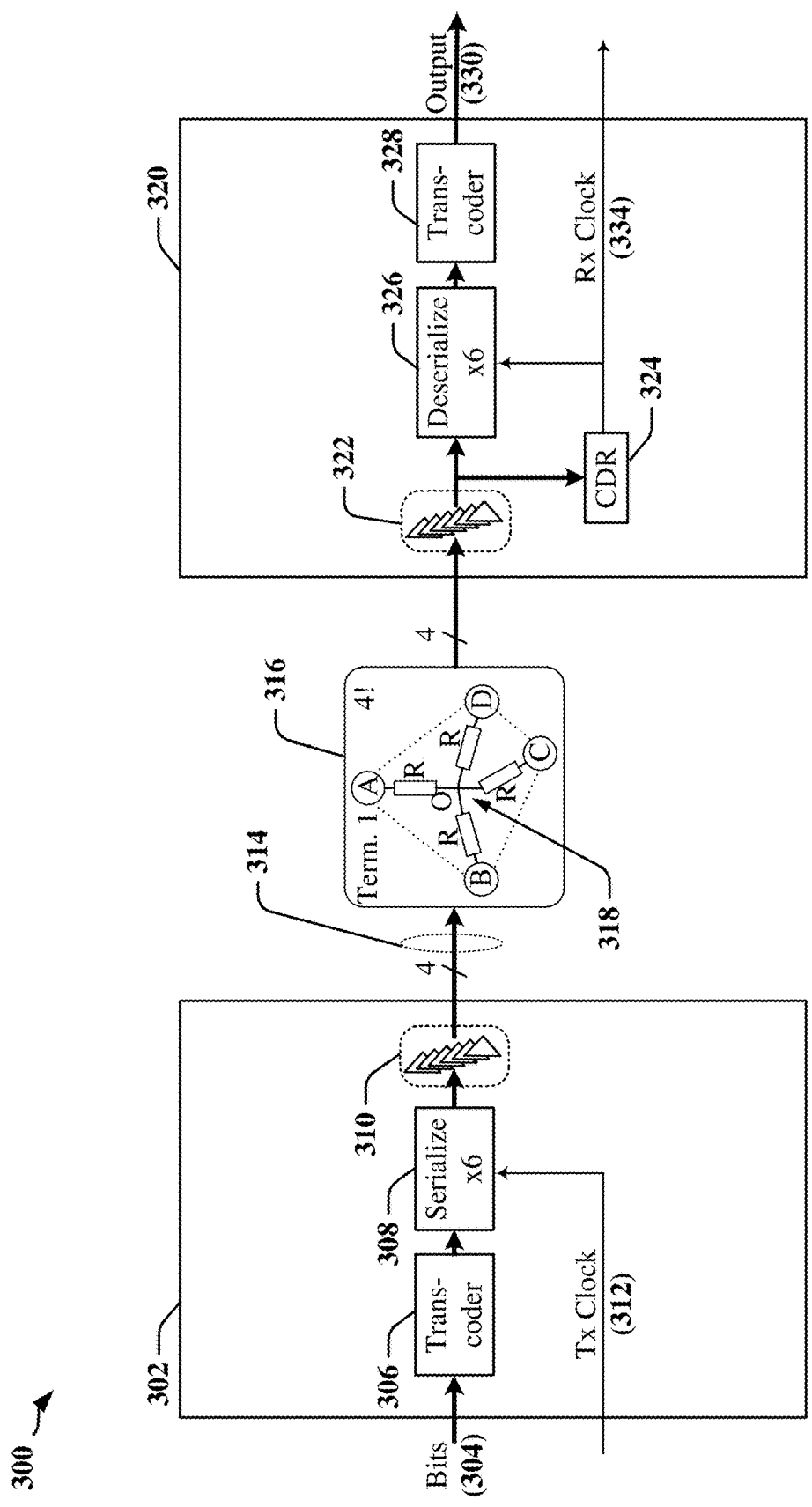
FIG. 3 illustrates an example of an N! interface provided between two devices.

FIG. 3 is a diagram illustrating one example of an N-wire interface 300 provided between two devices. At a transmitter 302, a transcoder 306 may be used to encode data bits 304 and clock information in symbols to be transmitted over a set of N wires 314 using N-factorial (N!) encoding. The clock information is derived from a transmit clock 312 and may be encoded in a sequence of symbols transmitted in $_NC_2$ differential signals over the N wires 314 by ensuring that a signaling state transition occurs on at least one of the $_NC_2$ signals between consecutive symbols. When N! encoding is used to drive the N wires 314, each bit of a symbol is transmitted as a differential signal by one of a set of differential line drivers 310, where the differential drivers in the set of differential line drivers 310 are coupled to different pairs of the N wires. The number of available combinations of wire pairs ($_NC_2$) determines the number of signals that can be transmitted over the N wires 314. The number of data bits 304 that can be encoded in a symbol may be calculated based on the number of available signaling states available for each symbol transmission interval.

A termination impedance (typically resistive) couples each of the N wires 314 to a common center point 318 in a termination network 316. It will be appreciated that the signaling states of the N wires 314 reflects a combination of the currents in the termination network 316 attributed to the differential line drivers 310 coupled to each wire. It will be further appreciated that the center point 318 is a null point, whereby the currents in the termination network 316 cancel each other at the center point.

The N! encoding scheme need not use a separate clock channel and/or non-return-to-zero decoding because at least one of the $_NC_2$ signals in the link transitions between consecutive symbols. Effectively, the transcoder 306 ensures that a transition occurs between each pair of symbols transmitted on the N wires 314 by producing a sequence of symbols in which each symbol is different from its immediate predecessor symbol. In the example depicted in FIG. 3, N=4 wires are provided, and the 4 wires can carry $_4C_2$=6 differential signals. The transcoder 306 may employ a mapping scheme to generate raw symbols for transmission on the N wires 314. The transcoder 306 may map data bits 304 to a set of transition numbers. The transition numbers may then be used to select a raw symbol for transmission based on the value of the preceding symbol such that the selected raw symbol is different from the preceding raw symbol. In one example, a transition number may be used to lookup a data value corresponding to the second of the consecutive raw symbols with reference to the first of the consecutive raw symbols. At the receiver 320, a transcoder 328 may employ a mapping to determine a transition number that characterizes a difference between a pair of consecutive raw symbols in a lookup table, for example. The transcoders 306, 328 operate on the basis that every consecutive pair of raw symbols includes two different symbols.

The transcoder 306 at the transmitter 302 may select between the N!−1 symbols that are available at every symbol transition. In one example, a 4! system provides 4!−1=23 signaling states for the next symbol to be transmitted at each symbol transition. The bit rate may be calculated as $\log_2$(available_states) per transmit clock cycle. In a system using double data rate (DDR) clocking, whereby symbol transitions occur at both the rising edge and falling edge of the transmit clock 312, two symbols are transmitted per transmit clock cycle. The total available states in the transmit clock cycle for N=4 is $(N!-1)^2=(23)^2=529$ and the number of data bits 304 that can be transmitted per symbol may be calculated as $\log_2(529)=9.047$ bits.

The receiver 320 receives the sequence of symbols using a set of line receivers 322 where each receiver in the set of line receivers 322 determines differences in signaling states on one pair of the N wires 314. Accordingly, $_NC_2$ receivers are used, where N represents the number of wires. The $_NC_2$ receivers produce a corresponding number of raw symbols as outputs. In the depicted N=4 wire example, the signals received on the four wires 314 are processed by 6 receivers ($_4C_2$=6) to produce a state transition signal that is provided to a corresponding CDR 324 and deserializer 326. The CDR 324 may produce a receive clock signal 334 that can be used by the deserializer 326. The receive clock signal 334 may be a DDR clock signal that can be used by external circuitry to receive data provided by the transcoder 328. The transcoder 328 decodes a block of received symbols from the deserializer 326 by comparing each next symbol to its immediate predecessor. The transcoder 328 produces output data 330 corresponding to the data bits 304 provided to the transmitter 302.

Transition Encoding Example

Figure 4:
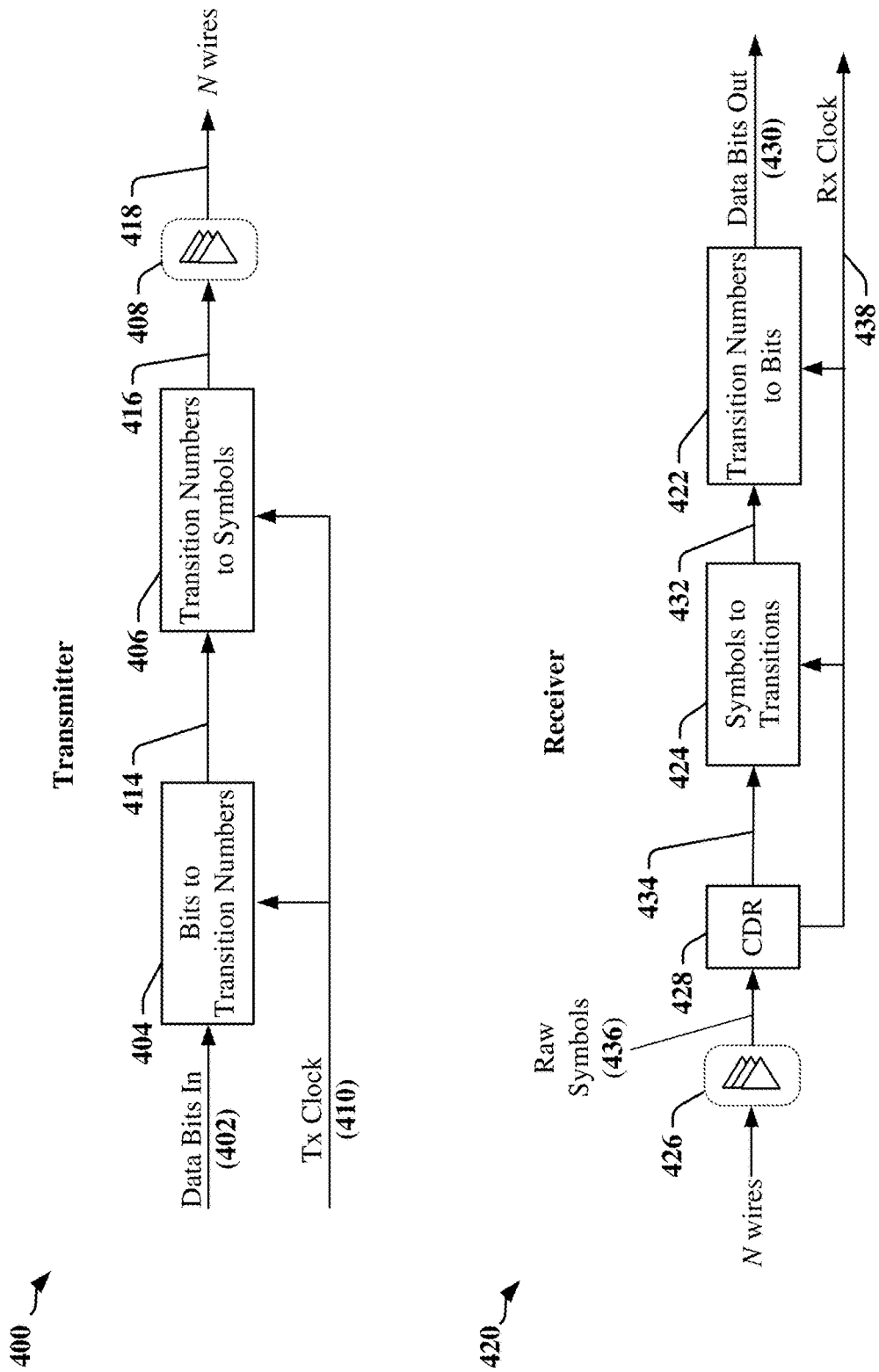
FIG. 4 illustrates a transmitter and a receiver that may be adapted according to certain aspects disclosed herein.

FIG. 4 is a block diagram illustrating a transmitter 400 and a receiver 420 configured according to certain aspects disclosed herein. The transmitter 400 and receiver 420 may be adapted for use with a variety of encoding techniques, including transition encoding used in N! and CCIe interfaces. The transmitter 400 includes a first converter 404 configured to convert data 402 into transition numbers 414. The transition numbers 414 may be used to select a next symbol for transmission based on the value of a current symbol, where the next symbol is different from a current symbol. A second converter, such as the encoder 406, receives the transition numbers and produces a sequence of symbols for transmission on the interface using suitably configured line drivers 408. Since no pair of consecutive symbols includes two identical symbols, a transition of signaling state occurs in at least one of the signal wires 418 of the interface at every symbol transition. At the receiver 420, a set of line receivers 426 provides raw symbols (SI) 436 to a CDR 428 that extracts a receive clock 438 and provides captured symbols (S) 434 to a circuit that converts the captured symbols 434 to transition numbers 432. The transition numbers may be decoded by a circuit 422 to provide output data 430.

In the example of a 3! system, the transmitter 400 may be configured or adapted to transcode data 402 into quinary (base-5) transition numbers 414 represented by 3 bits, in the example of a CCIe system, the transmitter 400 may be configured or adapted to transcode data 402 into ternary (base-3) transition numbers 414 represented by 2 bits. The transition numbers 414 may be encoded in a sequence of symbols 416 to be transmitted on the signal wires 418. The data 402 provided to the transmitter 400 may be one or more words, each word having a predefined number of bits. The first converter 404, which may be a transcoder, receives the data 402 and produces a sequence of transition numbers 414 for each data element. The sequence of transition numbers 414 may include a sufficient number of ternary numbers to encode a predefined number of bits of data, error detection and other information. The encoder 406 produces a sequence of symbols 416 that are transmitted through line drivers 408. In one example, the line drivers 408 may include open-drain output transistors. In another example, the line drivers 408 may include push-pull drivers. The output sequence of symbols 416 generated by the encoder has a transition in the state of at least one of the signal wires 418 between each pair of consecutive symbols in the sequence of symbols 416 by ensuring that no pair of consecutive symbols include two identical symbols. The availability of a transition of state in at least one of the signal wires permits a receiver 420 to extract a receive clock 438 from the sequence of symbols 416.

Figure 5:
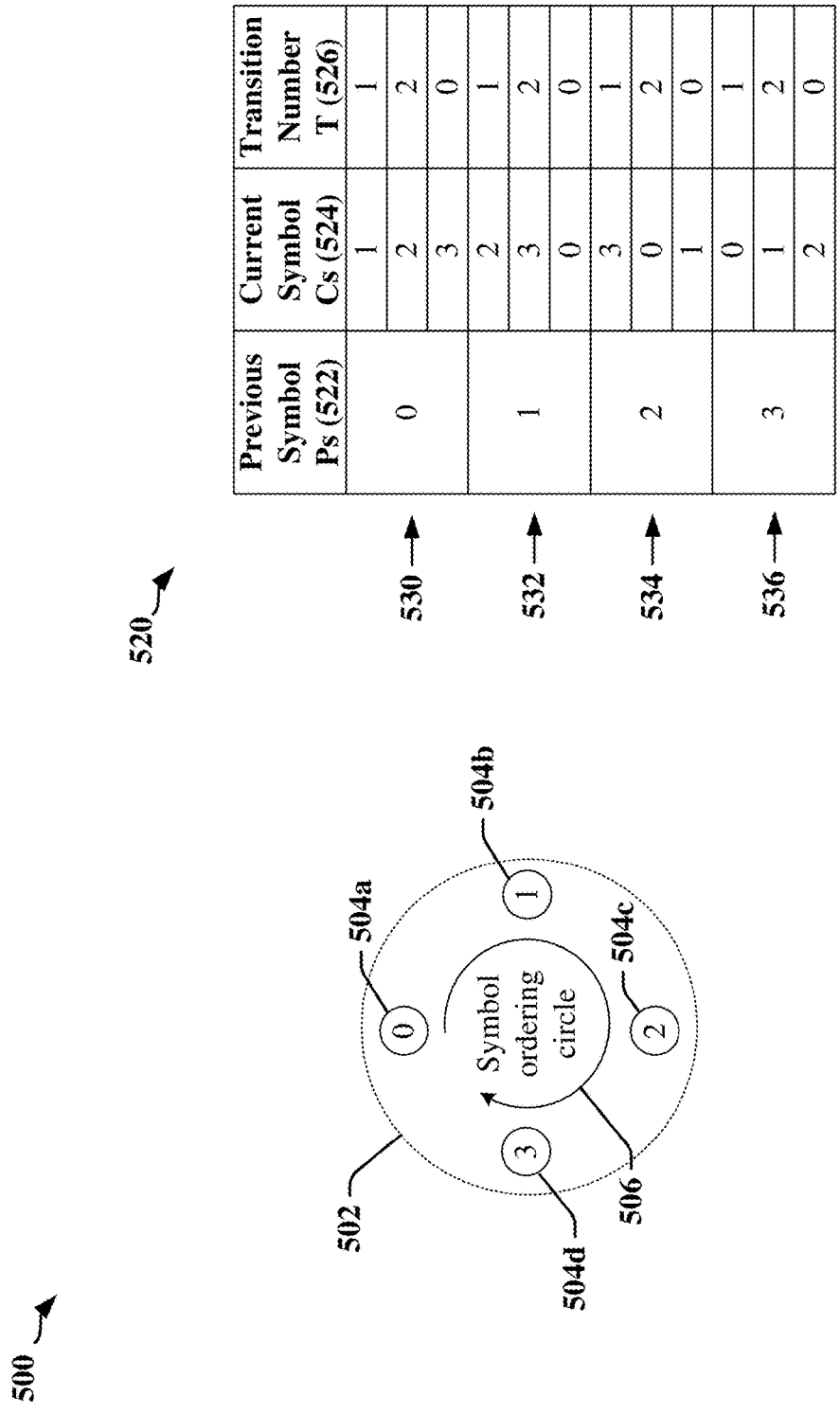
FIG. 5 illustrates an encoding scheme that may be used to control conversions between transition numbers and sequential symbols.

FIG. 5 is a drawing illustrating a simple example of an encoding scheme 500. In this example, the encoding scheme may be used by the encoder 406 configured to produce a sequence of symbols 416 for transmission on a two-wire CCIe interface. The encoding scheme 500 is also used by a transcoder 424 to extract data from symbols received from signals transmitted on the signal wires 418 of the interface. In the illustrated encoding scheme 500, the use of two signal wires 418 permits definition of 4 basic symbols S: {0, 1, 2, 3}. Any two consecutive symbols in the sequence of symbols 416, 434 have different states, and the symbol sequences 0,0, 1,1, 2,2 and 3,3 are invalid combinations of consecutive symbols. Accordingly, only 3 valid symbol transitions are available at each symbol boundary, where the symbol boundary is determined by the transmit clock and represents the point at which a first symbol (Ps) terminates and a second symbol (Cs) begins. The first symbol may be referred to as the preceding or previous symbol 522 terminates and the second symbol may be referred to as the current symbol 524.

According to certain aspects disclosed herein, the three available transitions are assigned a transition number (T) 526 for each previous symbol 522. The value of T 526 can be represented by a ternary number. In one example, the value of transition number 526 is determined by assigning a symbol-ordering circle 502 for the encoding scheme. The symbol-ordering circle 502 allocates locations 504a-504d on the symbol-ordering circle 502 for the four possible symbols, and a direction of rotation 506 between the locations 504a-504d. In the depicted example, the direction of rotation 506 is clockwise. The transition number 526 may represent the separation between the valid current symbols 524 and the immediately preceding previous symbol 522. Separation may be defined as the number of steps along the direction of rotation 506 on the symbol-ordering circle 502 required to reach the current symbol 524 from the previous symbol 522. The number of steps can be expressed as a single digit base-3 number. It will be appreciated that a three-step difference between symbols can be represented as a $0_{base-3}$. The table 520 in FIG. 5 summarizes an encoding scheme employing this approach.

At the transmitter 400, the table 520 may be used to lookup a current symbol 524 to be transmitted, given knowledge of the previous symbol 522 and an input ternary number, which is used as a transition number 526. At the receiver 420, the table 520 may be used as a lookup to determine a transition number 526 that represents the transition between the previous symbol 522 and the current symbol 524. The transition number 526 may be output as a ternary number.

The use of a transcoder that embeds clock information in a sequence of symbols can disassociate data 402 received for transmission by a transmitter 400 from the sequence of symbols 416 transmitted on signal wires 418. Consequently, a received raw symbol 436 cannot be directly decoded to obtain the data 402 provided to the transmitter 400 without consideration of at least one previously transmitted symbol. This disassociation can render conventional error correction techniques ineffective. For example, a conventional system may append an error correction code (ECC) to data 402, where the ECC may be a cyclic redundancy code (CRC) calculated from a predefined block size of data 402 or a packet length. The ECC may be used to identify and/or correct occurrences of errors during transmission in a conventional interface, where the errors may include one or more bit errors.

In an interface that uses transition encoding, symbol errors manifest in bursts of bit errors at the receiver. That is, multiple bit errors can be caused by a single symbol transmission error. In these circumstances, a CRC often exceeds Hamming distance and is not a practical solution for error detection.

Figure 6:
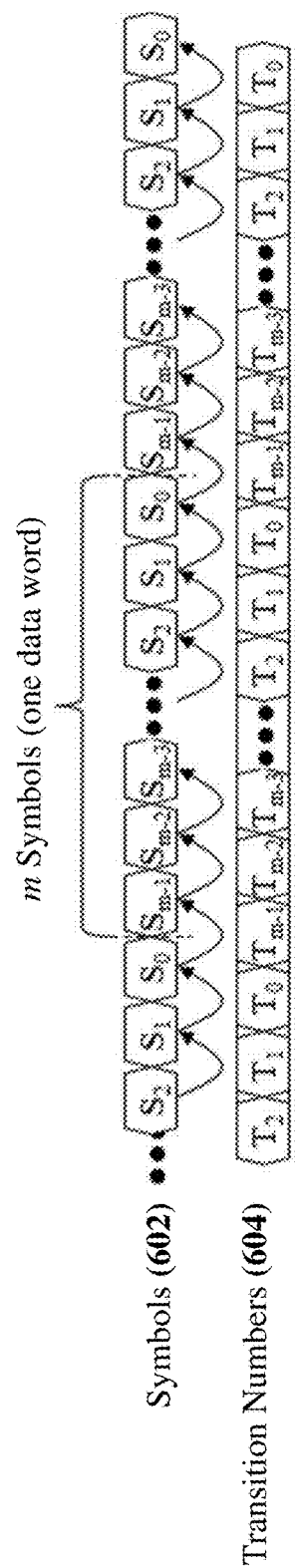
FIG. 6 illustrates the relationship between symbols and transition numbers in one example of a transition-encoding interface.

FIG. 6 is a timing diagram 600 that illustrates the relationship between symbols 602 and transition numbers 604, which may also be referred to herein as "transition symbols." In this example, each data word is encoded in m symbols transmitted on the multi-wire interface. A word transmitted in m symbols may be decoded using the formula:

$$\sum_{k=0}^{m-1} T_k r^k$$

where $T_k$ is the transition number at the $k^{th}$ iteration, and r is number of available symbols at each transition between symbols. For example, in a 3! interface where a self-transition is prohibited (to ensure that a receive clock can be reliably generated), r=5 states of the 6 defined states are available at each symbol transition. In various examples, the 3! interface may encode data in sequences of m=4 symbols or m=7 symbols. In a 4! interface, r=23 states of the 24 defined states are available at each symbol transition, and, the 4! interface may encode data in sequences of m=2 symbols. In a CCIe interface, r=3 states of the 4 defined states are available at each symbol and data words may be encoded in sequences of m=12 symbols. For a 3-wire single-ended interface, values of m=12 and r=7 may be used. For a 4-wire single-ended interface, values of m=10 and r=15 may be used.

Figure 7:
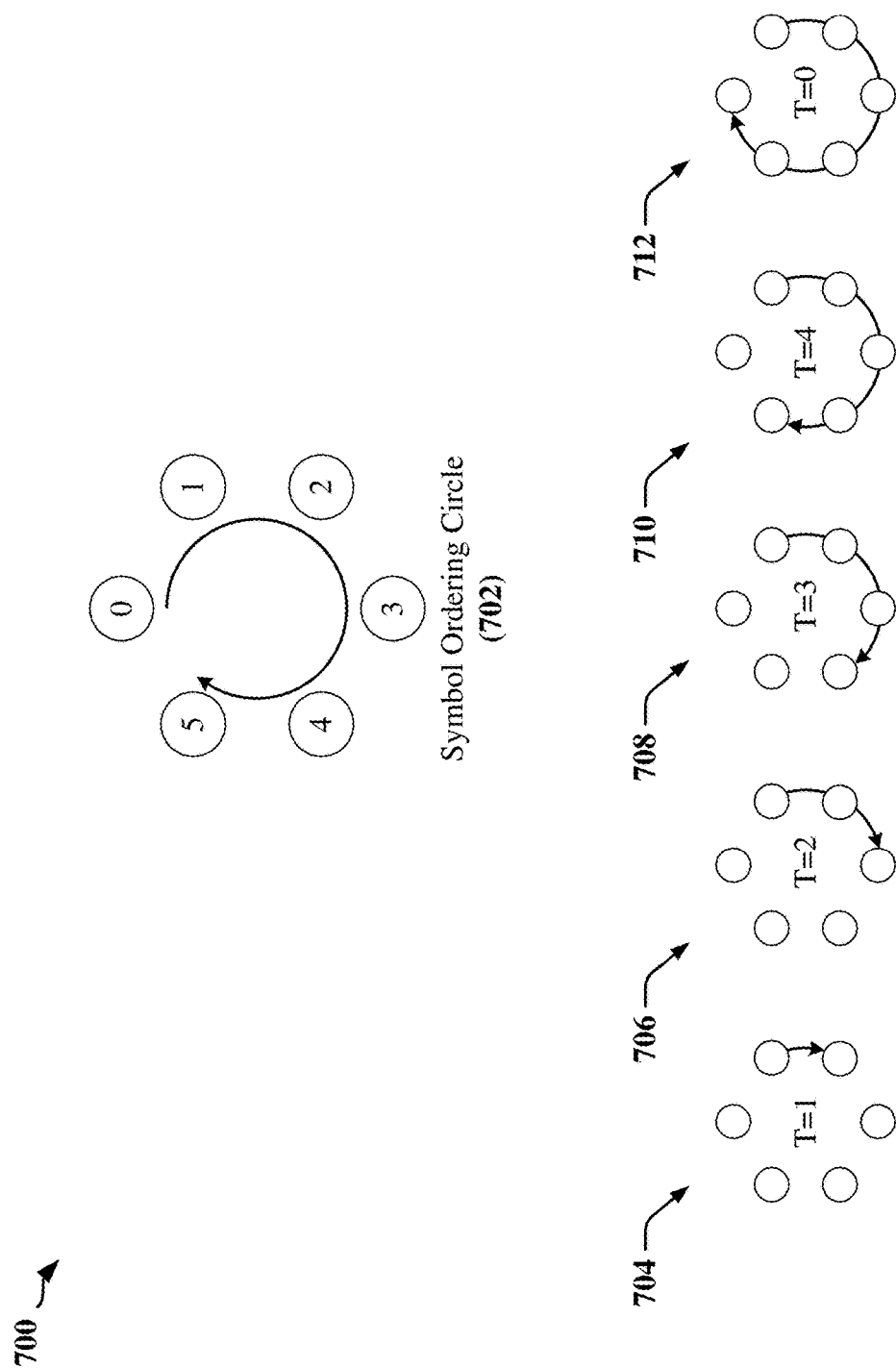
FIG. 7 illustrates possible transition number-to-symbol encoding at a symbol boundary in a 3! interface.

FIG. 7 is a drawing 700 that illustrates transition number-to-symbol encoding for a 3! interface. In this example, there are 6 possible symbols, S: {0, 1, 2, 3, 4, 5}, arranged around the symbol-ordering circle 702. Clock information is embedded in sequences of symbols by ensuring that the same symbol does not appear in any two consecutive symbol intervals. In this example, r=5, and a transition number (T) may be assigned a different value for each type of transition

704, 706, 708, 710, 712. The value of the transition number may indicate the location of a next symbol on the symbol-ordering circle 702 relative to the position of a current symbol on the symbol-ordering circle 702. The transition number may take a value in the range 1-5. Since the current symbol cannot be the same as the previous symbol, the number of steps between the current and next symbols cannot be zero.

A transition number may be assigned in accordance with the formula:

$$T=Ps+1 \leq Cs ? Cs-(Ps+1):Cs-(Ps+1)+6$$

Conversely, the current sequential symbol number (Cs) may be assigned according to:

$$Cs=Ps+1+T<6 ? Ps+1+T:Ps+1+T-6$$

where Cs is the current symbol, and Ps is the previously received symbol.

Figure 8:
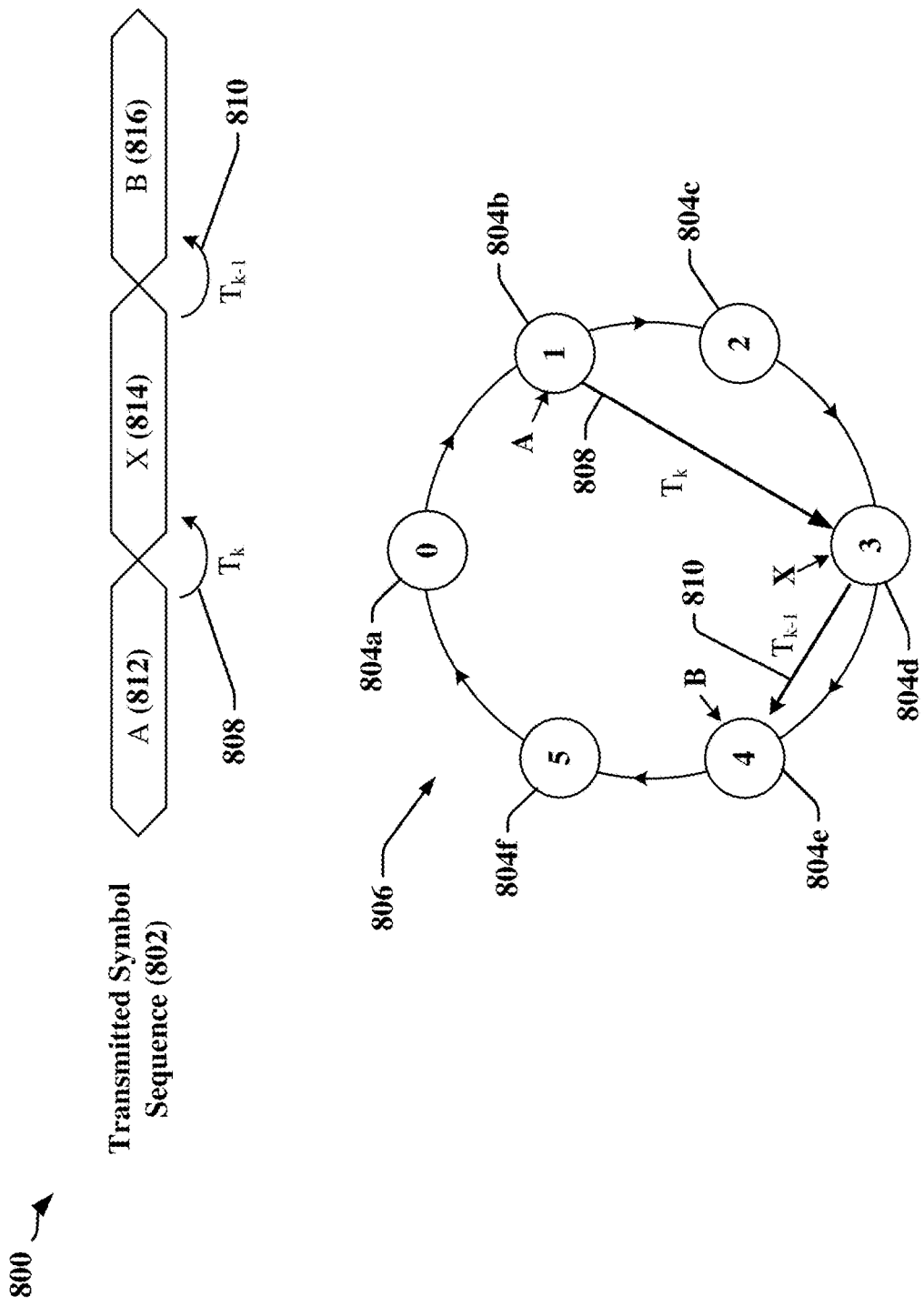
FIG. 8 illustrates a mathematical relationship between transition numbers and symbols in a 3! interface.

FIG. 8 is a diagram that illustrates a generalized example 800 of symbol transition clocking transcoding. In this example 800, an interface provides six possible signaling states per symbol transmitted on a multi-wire communication interface, with clock information embedded at each transition between consecutive symbols by ensuring that each pair of consecutively transmitted symbols includes two different symbols. Accordingly, 5 states are available at each transition between symbols. A data word is encoded by converting the bits of the data word to a transition number, which selects the next symbol to be transmitted based on the symbol being currently transmitted. In the example 800, three sequential symbols 812, 814, 816 are transmitted over the multi-wire communication interface, where each symbol 812, 814, 816 defines one of the six signaling states of the multi-wire communication interface. Data and clock information are encoded in the transitions between consecutive pairs of the symbols 812, 814, 816. The transitions may be represented as digits of transition numbers 808, 810. Each digit of the transition number identifies a transition between a pair of consecutive symbols in the sequence of symbols, and in this context, the digits may also be referred to as transition numbers. As noted herein, for a sequence of m symbols data is encoded as:

$$\text{data} = \sum_{k=0}^{m-1} T_k r^k$$

where k has a value between 0 and m−1. A first transition number ($T_k$) 808 corresponds to the transition between a first symbol 812 (A) and a second symbol 814 (X), and a second transition number ($T_{k-1}$) 810 corresponds to the transition between the second symbol 814 (X) and a third symbol 816 (B). Here, the first symbol 812 may encode the most significant bits of a data word.

In one example, a multi-bit data word may be converted to a sequence of m transition numbers. Each transition number may be expressed using a ternary number, quaternary number, quinary number, senary number, or using some other numeral system that can represent r transitions. That is, the numeral system may be a base r system providing numbers that can span the range 0 to r−1. Each transition number may select a next symbol for transmission based on the current symbol being transmitted. The next symbol is selected from symbols that are different from the current symbol in order to ensure a signaling state transition occurs in order to embed clock information in the sequence of symbols 802. That is, the transmission of two different symbols in a consecutive pair of symbols results in a change in signaling state of at least one wire of a multi-wire interface, and a receiver can generate a receive clock based on the changes detected in signaling state between consecutive symbols.

The symbol-ordering circle 806 illustrates one method of selecting a next symbol in the example 800. Here, the transition number may be expressed as a quinary number (base-5), with possible values {0, 1, 2, 3, 4}. For each of six possible symbols 804a-804f, one of six signaling states is transmitted on the multi-wire communication interface. The six symbols 804a-804f are arranged in different positions around the symbol-ordering circle 806. Given a current symbol location on the symbol-ordering circle 806 a transition number T may be encoded by selecting, as a next symbol, the symbol located T clockwise steps on the symbol-ordering circle 806. In one example, when the current symbol is Symbol-0 804a, a transition number value of T=1 selects Symbol-1 804b as the next symbol, a transition number value of T=2 selects Symbol-2 804c as the next symbol, a transition number value of T=3 selects Symbol-3 804c as the next symbol, and a transition number value of T=4 selects Symbol-4 804d as the next symbol. A transition number value of T=0 may cause a rollover in that the transition number selects the symbol 5 clockwise steps (or 1 counterclockwise steps) from the current symbol (Symbol-0 804a), thereby selecting Symbol-5 804f as the next symbol.

In the example of the transmitted sequence of symbols 802, the first symbol 812 in the sequence of symbols 802 may correspond to Symbol-1 804b. Input data may be processed to produce the first transition number 808 with a value of $T_k=2$, and the second transition number 810 with a value of $T_{k-1}=1$. The second symbol 814 may be determined to be Symbol-3 804d based on the value of $T_k$ and the third symbol 816 may be determined to be Symbol-4 804e based on the value of $T_{k-1}$.

At a receiver, the symbol-ordering circle 806 may be used to determine a transition number for each transition between consecutive symbols 812, 814, and/or 816. In one example, the receiver extracts a receive clock based on the occurrence of changes in signaling state between consecutive symbols 812, 814, and/or 816. The receiver may then capture the symbols 812, 814, 816 from the multi-wire interface and determine a transition number representing the transition between each pair of consecutive symbols 812, 814, and/or 816. In one example, the transition number may be determined by calculating the number of steps on the symbol-ordering circle 806 between the pair of consecutive symbols 812, 814.

Error Detection in a Transition Encoding Interface

According to certain aspects disclosed herein, reliable error detection may be implemented in a transition-encoded interface using an EDC added to data to be transmitted over the transition-encoded interface. The EDC may include a predefined number of bits, where the EDC has a known, fixed value. In one example, the EDC has a zero value when transmitted. In some instances, the EDC is provided as the least significant bits (LSBs) of each word to be transmitted on the interface. The form and structure of the EDC word may be selected such that a single signaling state error affecting a word causes the EDC decoded at the receiver to have a value that is different from the fixed value (e.g., a non-zero value).

Figure 9:
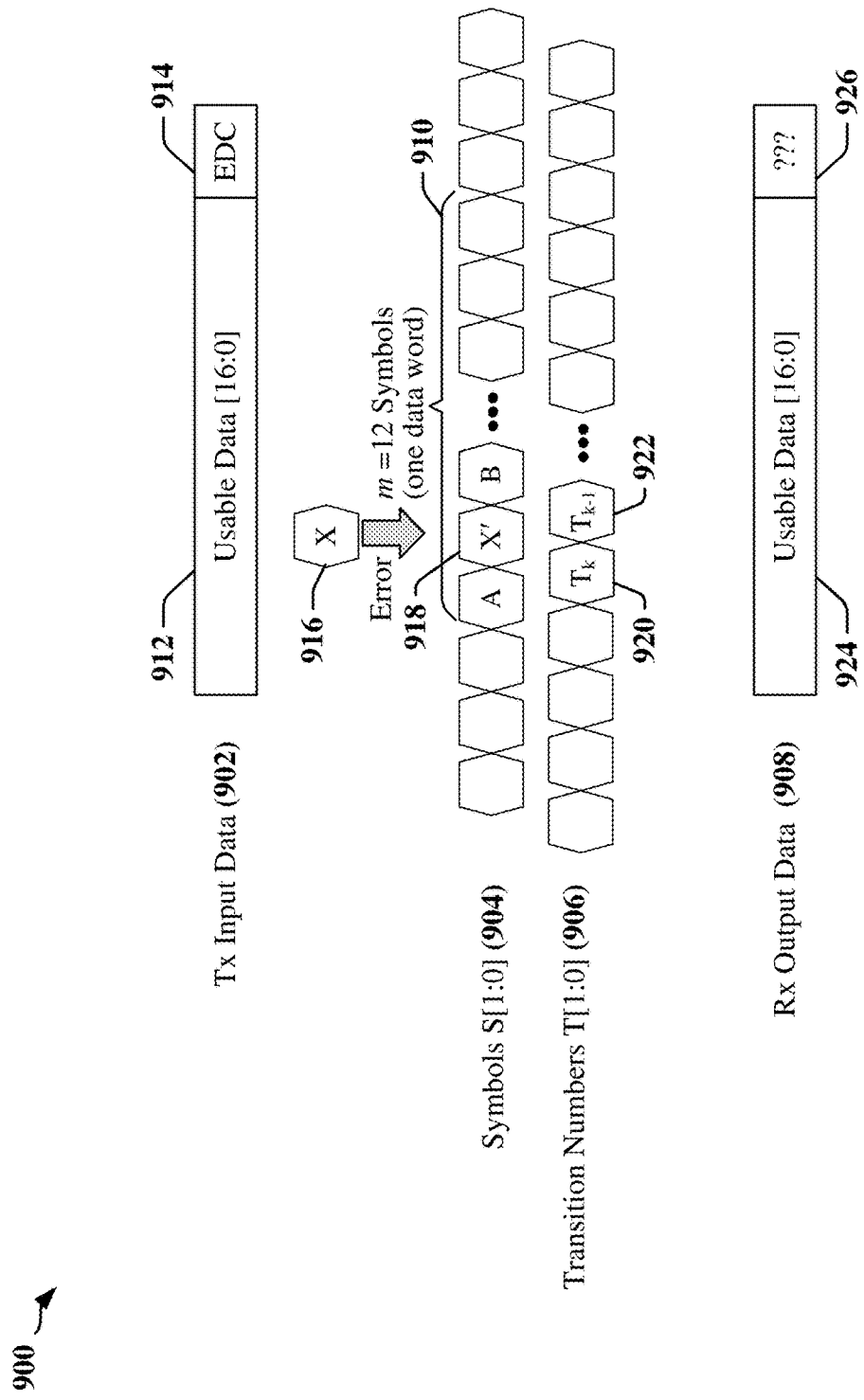
FIG. 9 illustrates an example in which a sequence of symbols transmitted over a multi-wire communication interface is affected by a single symbol error.

FIG. 9 illustrates an example 900 of the effect of a single error affecting a transition-encoded interface. In the example, a data word 912 is provided for transmission over the interface. An EDC 914 is appended to the data word 912 to produce a transmission word 902 that is input to and encoder. The transmission word 902 is transmitted in a sequence of symbols 910, where the sequence of symbols 910 includes 12 symbols. The sequence of symbols 910 is transmitted over a two-wire interface configured for CCIe operation and received at a receiver in a stream of symbols 904. In transmission, a signaling error occurs such that an originally-transmitted symbol 916 is modified and received as an erroneous symbol 918. A stream of transition numbers 906 corresponding to the received stream of symbols 904 includes transition numbers 920, 922 that include error offsets. A first transition number 920 represents the difference between the preceding symbol and the erroneous symbol 918, and a second transition number 922 represents the difference between the erroneous symbol 918 and the next symbol transmitted after the affected symbol.

The size, location, and structure of the EDC 914 may be selected such that the occurrence of a single symbol error produces an EDC 926 at the receiver that is different than the transmitted EDC 914. In one example, the EDC 914 includes multiple bits and may be set to a zero value. In the example of a CCIe interface, the EDC 914 may have three bits.

Figure 10:
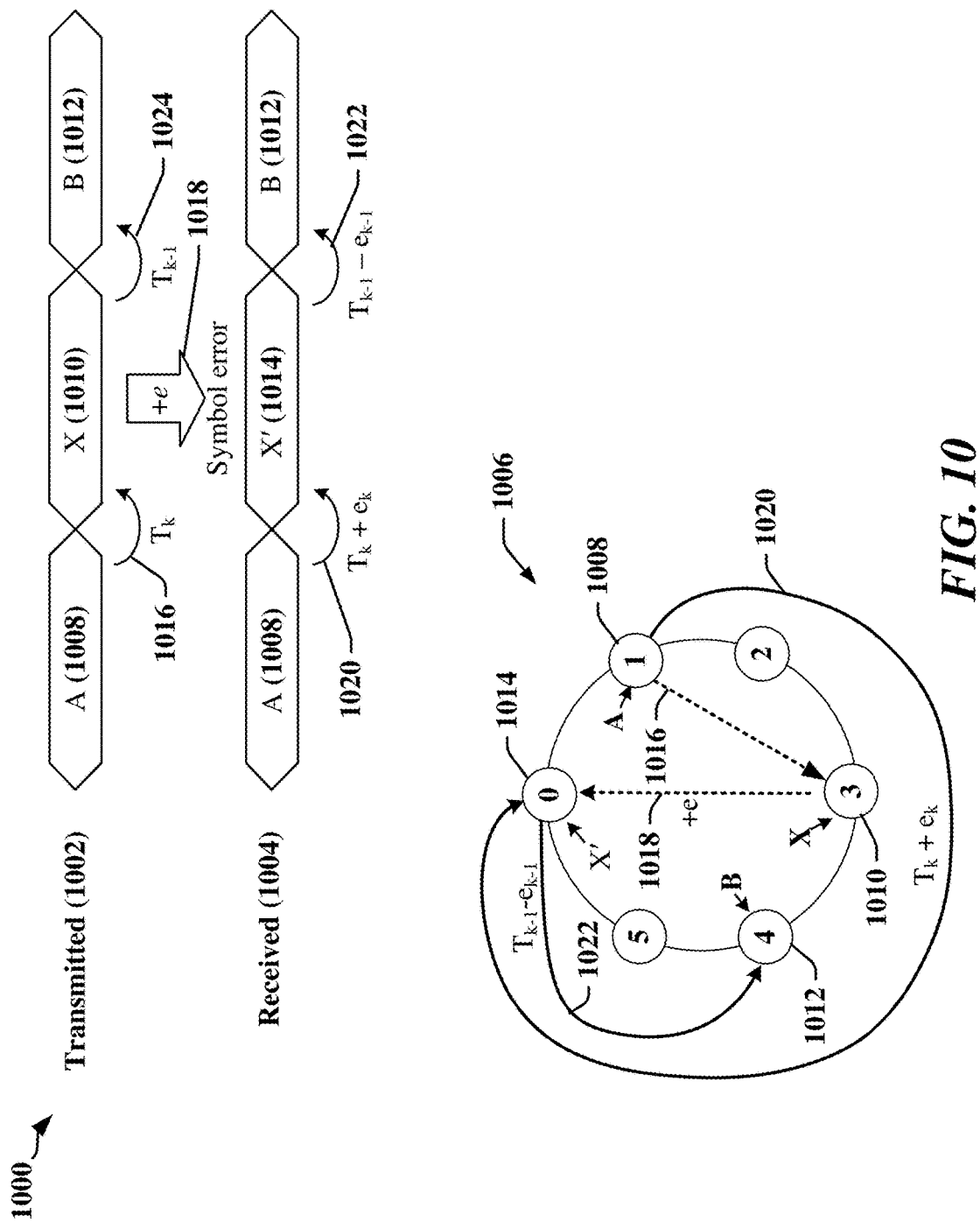
FIG. 10 is a diagram that illustrates a mathematical relationship characterizing a single symbol error in a sequence of symbols transmitted over a multi-wire communication interface.

FIG. 10 is a diagram that illustrates an example in which a sequence of symbols 1002 transmitted over a multi-wire communication interface is affected by a single symbol error 1018 resulting in the capture of an erroneous symbol 1014 in the received sequence of symbols 1004. The transmitted sequence of symbols 1002 includes a first symbol 1008 the A symbol), a second symbol (the X symbol 1010) and a third symbol 1012 (the B symbol). In the received sequence of symbols 1004, the first symbol 1008 and the third symbol 1012 are correctly received, while the second symbol 1014 is modified by the symbol error 1018 (displacement e) and is received as an erroneous symbol (the X' symbol 1014).

The occurrences of a single symbol error 1018 results in two transition number errors. The first incorrect transition number 1020 represents the transition between the correctly received first symbol 1008 and the X' Symbol 1014. The second incorrect transition number 1022 represents the transition between the X' Symbol 1014 and the correctly received third symbol 1012. The first incorrect transition number 1020 may be expressed as $T_k+e_k$, where $T_k$ is the first correct transition number 1016 corresponding to a transition between the first symbol 1008 and the X Symbol 1010, and $e_k$ is the value of the error created in the first incorrect transition number 1020 relative to the first correct transition number 1016. The second incorrect transition number 1022 may be expressed as $T_{k-1}+e_{k-1}$, where $T_{k-1}$ is the second correct transition number 1024 corresponding to the transition between the X Symbol 1010 and the third symbol 1012, and $e_{k-1}$ is the value of the error created in the second incorrect transition number 1022 relative to the first correct transition number 1024.

The effect of the single symbol error 1018 is illustrated in the decoding transition circle 1006. The first symbol 1008, which corresponds to Symbol-1, is initially received from the multi-wire interface. The next symbol is incorrectly captured as the X' Symbol 1014 due to error. The X' Symbol 1014 may correspond to Symbol-0. The third symbol 1012, which corresponds to Symbol-4, is then received from the multi-wire interface. In this example, the most significant symbol is transmitted first, and:

$e=3, T_k=2, T_{k-1}=1$ $T_k+e=2+3=5=0_{base5}$, and $e_k=-2$ $T_{k-1}-e=1-3=-2=4_{base5}$, and $e_{k-1}=-3$ Each data word may be represented by a sequence of transition numbers: $\{T_0, T_1, \ldots, T_{m-1}\}$.

The displacement error e represents the difference between the transmitted X symbol 1010 and the received X' Symbol 1014, which may correspond to a number of steps in the decoding transition circle 1006. The value of e is not necessarily equal in value to $e_k$ due to roll over in the number system used to express transition numbers. For example, a transition number with a value of 3 may represent the difference between the transmitted X symbol 1014 and the received X' Symbol 1014 the first correct transition number 1016 on the decoding transition circle 1006 caused by the displacement error e, while the value of $e_k$ has a value of –2.

For two consecutive symbol transitions:

$$\text{Bits}=T_k r^k + T_{k-1} r^{k-1}$$

The result of a single error affecting two consecutive symbols may be expressed as:

$$\text{Bits}' = (T_k + e_k)r^k + (T_{k-1} - e_{k-1})r^{k-1}$$
$$= (T_k r^k + T_{k-1} r^{k-1}) + (e_k r - e_{k-1})r^{k-1}$$

where:

$(e_k r - e_{k-1})r^{k-1}$ may be referred to as the error effect,
$(e_k r - e_{k-1})$ may be referred to as the error coefficient, and
$r^{k-1}$ may be referred to as the base power.

According to certain aspects, a transition-encoded interface may be configured such that r is an odd number. When r is an odd number, it follows that $r^{k-1}$ is also an odd number (LSB is non-zero). Accordingly, the value of $(e_k r - e_{k-1})$ determines the number of LSBs required for an EDC. FIG. 11 provides a listing of $r^n$ (where n lies in the range 0 to 15) when r=3 and 5. The first table 1100 may relate to a CCIe interface, where r=3 transitions are available at each symbol interval. In each instance, the LSB 1104 of the base power is set to '1.' The second example 1102 may relate to a 3-wire 3! interface, where r=5 transitions are available at each symbol interval (6 possible symbols). In each instance, the LSB 1206 of the base power is set to '1.'

FIG. 12 is a table 1200 that tabulates error coefficients and illustrates error coefficient when a symbol error does not involve repetition of a symbol in consecutive symbol intervals, which would cause a clock miss. $|e_k|$ is always smaller than r. That is:

$$1 \le |e_k| \le r-1,$$

$$1 \le |e_{k-1}| \le r-1.$$

Since the least value of $|e_k|$ is 1, the least value for $|e_k r|$ is r. The largest value of $|e_{k-1}|$ is r–1. The error coefficient $(e_k r - e_{k-1})$ is never zero when a single symbol error is present.

FIG. 13 illustrates an example 1300 of calculation and tabulation of the longest non-zero LSB portion in an error coefficient. Here, the power of 2 LSBs of $(e_k r - e_{k-1})$ is the longest when both $|e_k|$ and $|e_{k-1}|$ are longest power of 2 ($2^n$), and $e_k = e_{k-1}$. The Longest power of 2 LSBs of error coefficient determines the size of the "error detection constant LSBs."

Certain aspects disclosed herein may be applied to interfaces which do not use transition encoding to embed clock information in a sequence of symbols. In some instances, data may be transcoded to a numbering system that has an odd base. For example, data may be transcoded to a numbering system such as a ternary numbering system, a quinary numbering system, a septenary numbering system, etc.

FIG. 14 illustrates two examples 1400, 1420 of cases in which a single symbol error results in an error in a single transition number 1408, 1426. In the first example 1400, a signaling error affects the last transmitted symbol 1402 in a preceding sequence of symbols. The signaling error causes a receiver to detect a modified symbol 1404 as the last-received symbol in the preceding sequence of symbols. The error may introduce an offset in the transition number 1406 that represents the difference between the last transmitted symbol 1402 in a preceding sequence of symbols and the first symbol of a current sequence of symbols. In the first example 1400, the effect of the error may be expressed as: $e_{m-1}r^{m-1}$, where the error coefficient is $e_{m-1}$ and the base power is $r^{m-1}$.

In the second example 1420, a signaling error affects the last transmitted symbol 1422 in a current sequence of symbols. The signaling error causes a receiver to detect a modified symbol 1424 as the last-received symbol in the current sequence of symbols. The error may introduce an offset in the transition number 1426 that represents the difference between the last transmitted symbol 1422 in the current sequence of symbols and the first symbol of a next sequence of symbols. In the first example 1400, the effect of the error may be expressed as $e_0$.

Table 1 lists the number of LSBs in an EDC that can detect a single symbol error in a multi-wire interface that uses transition encoding.

TABLE 1

| r | EDC length (bits) | Example |
|---|---|---|
| 3 | 3 | 2-wire single-ended (e.g. CCIe) |
| 5 | 5 | 3-wire multi-level differential (3!) |
| 7 | 6 | 3-wire single ended |
| 9 | 7 | |
| 11 | 5 | |
| 13 | 6 | |
| 15 | 8 | 4-wire single-ended |
| 17 | 9 | |
| 19 | 8 | |
| 21 | 7 | |
| 23 | 6 | 4-wire multi-level differential (4!) |

The cases illustrated in FIG. 14 do not affect the maximum number of LSBs required in an EDC to permit detection of a single symbol error.

Detection of Multiple Symbol Errors Per Word

FIG. 15 is a timing diagram 1500 that illustrates a first example of signaling errors that affect two symbols 1504, 1506 in a sequence of symbols 1502 that encodes a single data word. FIG. 15 relates to an example in which signaling errors affect two non-consecutive symbols. The errors in symbols 1504, 1506 result in corresponding pairs of transition errors 1508, 1510. These transition errors result in erroneous transition numbers 1512, 1514, 1516, 1518. The error effect attributable to the first affected symbol 1504 may be stated as $(e_kr - e_{k-1})r^{k-1}$, while the error effect attributable to the first affected symbol 1504 may be stated as $(e_jr - e_{j-1})r^{j-1}$. Multiple symbol errors can be detected provided if the total effect of the error $$(e_kr - e_{k-1})r^{k-1} + (e_jr - e_{j-1})r^{j-1}$$

always modifies an EDC that has a predetermined length and value.

FIG. 16 is a timing diagram 1600 that illustrates a second example of signaling errors that affect two consecutive symbols 1604, 1606 in a sequence of symbols 1602 that encodes a single word. The errors in the consecutive symbols 1604, 1606 result in transition errors 1608 that cause the generation of three erroneous transition numbers 1610, 1612, 1614. The error effect attributable to the affected symbols 1504, 1506 may be stated as $(e_kr^2 + e_{k-1}r + e_{k-2})r^{k-2}$. The error effect attributable to errors affecting consecutive symbols 1604, 1606 can be detected with a shorter EDC than errors in non-consecutive symbols 1504, 1506 in receivers adapted in accordance with certain aspects disclosed herein.

FIG. 17 is a table 1700 that illustrates the number of bits of an EDC used for various values of r (available transitions per symbol boundary) and m (number of symbols used to encode a data element). The size of an EDC used for detecting two symbol errors varies with the value of m. The first row (shaded) of the table 1700 corresponds to an EDC used to detect a single symbol error.

According to certain aspects disclosed herein, a receiver can be configured to detect two symbol errors in a sequence of symbols representing a data word, when an EDC of sufficient length is transmitted with the data word. The length of the EDC may be determined based on the number of symbols used to encode a data word and the number of transitions available at the boundary between a pair of consecutively transmitted symbols.

Symbol slip error caused by clock miss or extra clock may not be detected by an error detection constant. However, the majority of these types of errors can be detected by higher protocol layers, at the next word, and/or using a state machine at the receiver device.

FIG. 18 illustrates a transmitter 1800 and a receiver 1840 coupled by an N-wire serial bus 1820, where each transmission over the serial bus 1820 includes an EDC (error detection constant) provided in accordance with certain aspects disclosed herein. The transmitter 1800 may include an EDC insertion circuit 1804 adapted to append an EDC to a data word 1802, where the data word 1802 is provided as an input to the transmitter 1800. The EDC insertion circuit 1804 may provide an enhanced data word 1814 to a first encoder 1806 that is configured to convert the enhanced data word 1814 into a transition number 1816. The transmitter 1800 may include a second encoder 1808 configured to generate a sequence of symbols 1818 from the transition number 1816. Each symbol in the sequence of symbols 1818 may be generated using a digit of the transition number 1816 and a preceding symbol in the sequence of symbols 1818. A communications transceiver 1810 may be configured to transmit the sequence of symbols 1818 on the serial bus 1820. In some embodiments, clock information may be embedded in transitions between consecutive symbols in the sequence of symbols 1818.

The EDC may have a length and a predefined value selected to enable the receiver 1840 to detect a symbol error in the sequence of symbols 1818 corresponding to the data word 1802. In some instances, the length and the predefined value of the EDC may be selected to enable the receiver 1840 to detect transmission errors affecting multiple symbols in the sequence of symbols 1818. The EDC insertion circuit 1804 may append the EDC as a predefined number of least significant bits. The number of least significant bits may be determined based on a total number of states per symbol available for encoding data transmissions on the serial bus 1820 and/or a total number of symbols used to encode the data word 1802 and the EDC.

In one example, the serial bus 1820 has N single-ended connectors, and the total number of states per symbol available for encoding data transmissions is 2N−x, where x is at least 1. In another example, the the serial bus 1820 has N multi-level differential connectors, and the total number of states per symbol available for encoding data transmissions is N!−x, where x is at least 1. In another example, the total number of states available at each transition is 3, and the EDC includes 8 bits. In another example, the total number of states available at each transition is 3, the sequence of symbols includes 17 or more symbols, and the EDC includes 9 bits. In another example, the total number of states available at each transition is 5, and the EDC includes 10 bits. In another example, the total number of states available at each transition is 5, the sequence of symbols includes 8 or more symbols, and the EDC includes 11 bits.

The receiver 1840 may include a communications transceiver 1846 that can be configured to receive a sequence of raw symbols 1856 from the serial bus 1820. In some instances, the receiver 1840 may include a clock and data recovery circuit (CDR) 1848 that provides a receive clock signal 1858 and a sequence of captured symbols 1854 to a first decoder 1844. The first decoder 1844 converts the sequence of captured symbols 1854 to a transition number 1852. Each digit of the transition number 1852 may represent a transition between two consecutive symbols in the sequence of captured symbols 1854. The receiver 1840 may include a second decoder 1842 that is adapted to convert the transition number 1852 to one or more words 1850, 1862. In the illustrated example, an EDC word 1862 may be provided to an error detection circuit 1864, which produces a signal 1860 indicating whether an error occurred during transmission. The error detection circuit 1864 may include combinational logic and/or comparators configured to compare the EDC word 1862 to an expected, predefined value. An error may be identified when the EDC word 1862 does not match the predefined value. In one example, the predefined value is zero, and each bit of the EDC word 1862 is expected to be a '0' bit. A portion of the bits decoded by the second decoder 1842 may be provided as the output data word 1850. In some examples, the receive clock signal 1858 may be derived from clock information embedded in transitions between consecutive symbols in the sequence of raw symbols 1856.

Example of a Processing Circuit

FIG. 19 is a conceptual diagram 1900 illustrating a simplified example of a hardware implementation for an apparatus employing a processing circuit 1902 that may be configured to perform one or more functions disclosed herein. In accordance with various aspects of the disclosure, an element, or any portion of an element, or any combination of elements as disclosed herein may be implemented using the processing circuit 1902. The processing circuit 1902 may include one or more processors 1904 that are controlled by some combination of hardware and software modules. Examples of processors 1904 include microprocessors, microcontrollers, digital signal processors (DSPs), field programmable gate arrays (FPGAs), programmable logic devices (PLDs), state machines, sequencers, gated logic, discrete hardware circuits, and other suitable hardware configured to perform the various functionality described throughout this disclosure. The one or more processors 1904 may include specialized processors that perform specific functions, and that may be configured, augmented or controlled by one of the software modules 1916. The one or more processors 1904 may be configured through a combination of software modules 1916 loaded during initialization, and further configured by loading or unloading one or more software modules 1916 during operation.

In the illustrated example, the processing circuit 1902 may be implemented with a bus architecture, represented generally by the bus 1910. The bus 1910 may include any number of interconnecting buses and bridges depending on the specific application of the processing circuit 1902 and the overall design constraints. The bus 1910 links together various circuits including the one or more processors 1904, and storage 1906. Storage 1906 may include memory devices and mass storage devices, and may be referred to herein as computer-readable media and/or processor-readable media. The bus 1910 may also link various other circuits such as timing sources, timers, peripherals, voltage regulators, and power management circuits. A bus interface 1908 may provide an interface between the bus 1910 and one or more transceivers 1912. A transceiver 1912 may be provided for each networking technology supported by the processing circuit. In some instances, multiple networking technologies may share some or all of the circuitry or processing modules found in a transceiver 1912. Each transceiver 1912 provides a means for communicating with various other apparatus over a transmission medium. Depending upon the nature of the apparatus, a user interface 1918 (e.g., keypad, display, touch interface, speaker, microphone, joystick) may also be provided, and may be communicatively coupled to the bus 1910 directly or through the bus interface 1908.

A processor 1904 may be responsible for managing the bus 1910 and for general processing that may include the execution of software stored in a computer-readable medium that may include the storage 1906. In this respect, the processing circuit 1902, including the processor 1904, may be used to implement any of the methods, functions and techniques disclosed herein. The storage 1906 may be used for storing data that is manipulated by the processor 1904 when executing software, and the software may be configured to implement any one of the methods disclosed herein.

One or more processors 1904 in the processing circuit 1902 may execute software. Software shall be construed broadly to mean instructions, instruction sets, code, code segments, program code, programs, subprograms, software modules, applications, software applications, software packages, routines, subroutines, objects, executables, threads of execution, procedures, functions, algorithms, etc., whether referred to as software, firmware, middleware, microcode, hardware description language, or otherwise. The software may reside in computer-readable form in the storage 1906 or in an external computer readable medium. The external computer-readable medium and/or storage 1906 may include a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a "flash drive," a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium and/or storage 1906 may also include, by way of example, a carrier wave, a transmission line, and any other suitable medium for transmitting software and/or instructions that may be accessed and read by a computer. Computer-readable medium and/or the storage 1906 may reside in the processing circuit 1902, in the processor 1904, external to the processing circuit 1902, or be distributed across multiple entities including the processing circuit 1902. The computer-readable medium and/or storage 1906 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

The storage 1906 may maintain software maintained and/or organized in loadable code segments, modules, applications, programs, etc., which may be referred to herein as software modules 1916. Each of the software modules 1916 may include instructions and data that, when installed or loaded on the processing circuit 1902 and executed by the one or more processors 1904, contribute to a run-time image 1914 that controls the operation of the one or more processors 1904. When executed, certain instructions may cause the processing circuit 1902 to perform functions in accordance with certain methods, algorithms and processes described herein.

Some of the software modules 1916 may be loaded during initialization of the processing circuit 1902, and these software modules 1916 may configure the processing circuit 1902 to enable performance of the various functions disclosed herein. For example, some software modules 1916 may configure internal devices and/or logic circuits 1922 of the processor 1904, and may manage access to external devices such as the transceiver 1912, the bus interface 1908, the user interface 1918, timers, mathematical coprocessors, and so on. The software modules 1916 may include a control program and/or an operating system that interacts with interrupt handlers and device drivers, and that controls access to various resources provided by the processing circuit 1902. The resources may include memory, processing time, access to the transceiver 1912, the user interface 1918, and so on.

One or more processors 1904 of the processing circuit 1902 may be multifunctional, whereby some of the software modules 1916 are loaded and configured to perform different functions or different instances of the same function. The one or more processors 1904 may additionally be adapted to manage background tasks initiated in response to inputs from the user interface 1918, the transceiver 1912, and device drivers, for example. To support the performance of multiple functions, the one or more processors 1904 may be configured to provide a multitasking environment, whereby each of a plurality of functions is implemented as a set of tasks serviced by the one or more processors 1904 as needed or desired. In one example, the multitasking environment may be implemented using a timesharing program 1920 that passes control of a processor 1904 between different tasks, whereby each task returns control of the one or more processors 1904 to the timesharing program 1920 upon completion of any outstanding operations and/or in response to an input such as an interrupt. When a task has control of the one or more processors 1904, the processing circuit is effectively specialized for the purposes addressed by the function associated with the controlling task. The timesharing program 1920 may include art operating system, a main loop that transfers control on a round-robin basis, a function that allocates control of the one or more processors 1904 in accordance with a prioritization of the functions, and/or an interrupt driven main loop that responds to external events by providing control of the one or more processors 1904 to a handling function.

FIG. 20 is a flowchart illustrating a method for data communications on a multi-wire communications interface that employs transcoding. The method may be performed using a transmitting circuit.

At block 2002, the transmitting circuit may provide a plurality of bits to be transmitted over a plurality of connectors. The plurality of bits may include an EDC. The EDC may have a predefined value and a fixed length. The EDC may be used for error detection.

At block 2004, the transmitting circuit may convert the plurality of bits into a transition number. The transition number may be expressed using a numeral system based on a maximum number of possible states per symbol.

At block 2006, the transmitting circuit may transmit the transition number as a sequence of symbols on the plurality of connectors.

In some examples, the transmitting circuit may generate each symbol in the sequence of symbols using a digit of the transition number and a preceding symbol in the sequence of symbols. In some examples, clock information is embedded in transitions between consecutive symbols in the sequence of symbols.

The EDC may be modified when one or two symbols in the sequence of symbols are modified during transmission. A transmission error affecting the one or more symbols in the sequence of symbols may result in the EDC having a value different from the predefined value when decoded at a receiver.

In some instances, the EDC is provided as a number of least significant bits. The number of least significant bits may be determined based on a total number of states per symbol available for encoding data transmissions on the plurality of connectors.

In one example, the total number of states number available at each transition is 3 and the EDC includes 8 bits, when 16 or fewer symbols are transmitted per data word. When the sequence of symbols includes 17 or more symbols and the number of available states is 3, the EDC may include 9 bits.

In another example, the total number of states number available at each transition is 5 and the EDC includes 10 bits, when 7 or fewer symbols are transmitted per data word.

FIG. 21 is a conceptual diagram illustrating an example of a hardware implementation for an apparatus 2100 employing a processing circuit 2102. In this example, the processing circuit 2102 may be implemented with a bus architecture, represented generally by the bus 2116. The bus 2116 may include any number of interconnecting buses and bridges depending on the specific application of the processing circuit 2102 and the overall design constraints. The bus 2116 links together various circuits including one or more processors, represented generally by the processor 2112, and computer-readable media, represented generally by the processor-readable storage medium 2114. The bus 2116 may also link various other circuits such as timing sources, timers, peripherals, voltage regulators, and power management circuits. A transceiver or communications interface 2118 provides a means for communicating with various other apparatus over a multi-wire interface 2120. Depending upon the nature of the apparatus, a user interface (e.g., keypad, display, speaker, microphone, joystick) may also be provided. One or more clock generation circuits may be provided within the processing circuit 2102 or controlled by the processing circuit 2102 and/or one or more processors 2112. In one example, the clock generation circuits may include one or more crystal oscillators, one or more phase-locked loop devices, and/or one or more configurable clock trees.

The processor 2112 is responsible for managing the bus 2116 and general processing, including the execution of software stored on the processor-readable storage medium 2114. The software, when executed by the processor 2112, causes the processing circuit 2102 to perform the various functions described supra for any particular apparatus. The processor-readable storage medium 2114 may be used for storing data that is manipulated by the processor 2112 when executing software.

In one configuration, the processing circuit may include one or more modules and/or circuits 2104 for encoding data words with EDCs in transition numbers, one or more modules and/or circuits 2106 for generating sequences of symbols based on the transition numbers to obtain, and one or more modules and/or circuits 2108 for transmitting the sequences of symbols in the signaling state of the multi-wire interface 2120.

FIG. 22 is a flowchart illustrating a method for data communications on a multi-wire communications interface that employs transcoding. The method may be performed using a receiving circuit.

At block 2202, the receiving circuit may receive a sequence of symbols from a plurality of connectors. In some examples, clock information is embedded in transitions between consecutive symbols in the sequence of symbols.

At block 2204, the receiving circuit may convert the sequence of symbols into a transition number. Each digit of the transition number may represent a transition between two consecutive symbols transmitted on the plurality of connectors. The transition number may be expressed using a numeral system based on a maximum number of possible symbol transitions between a pair of consecutive symbols transmitted on the plurality of connectors.

At block 2206, the receiving circuit may convert the transition number into a plurality of bits.

At block 2208, the receiving circuit may determine whether a symbol error has occurred during transmission of the sequence of symbols based on a value of an EDC included in the plurality of bits. The EDC may have a predefined value and a length determined based on a total number of states per symbol defined for encoding data transmissions on the plurality of connectors. In some instances, one or more symbol errors may cause a decoded version of the EDC to have a value that is different from the predefined value.

In some examples, the EDC may be provided as a predefined number of least significant bits in the plurality of bits. The predefined number of LSBs may be determined based on a total number of states per symbol available for encoding data transmissions on the plurality of connectors. The predefined number of LSBs may be determined based on a total number of symbols used to encode the data word.

The plurality of connectors may include a number (N) single-ended connectors, the total number of states per symbol available for encoding data transmissions is $2^N-x$, where x is at least 1.

In one example, the total number of states number available at each transition is 3 and the EDC includes 8 bits. When the total number of states number available at each transition is 3, and when the sequence of symbols includes 17 or more symbols, the EDC may include 9 bits.

In another example, the total number of states number available at each transition may be 5 and the EDC may include 10 bits. When the total number of states number available at each transition is 5, and when the sequence of symbols includes 8 or more symbols, the EDC may include 11 bits.

FIG. 23 is a conceptual diagram illustrating an example of a hardware implementation for an apparatus 2300 employing a processing circuit 2302. In this example, the processing circuit 2302 may be implemented with a bus architecture, represented generally by the bus 2316. The bus 2316 may include any number of interconnecting buses and bridges depending on the specific application of the processing circuit 2302 and the overall design constraints. The bus 2316 links together various circuits including one or more processors, represented generally by the processor 2312, and computer-readable media, represented generally by the processor-readable storage medium 2314. The bus 2316 may also link various other circuits such as timing sources, timers, peripherals, voltage regulators, and power management circuits. A transceiver or communications interface 2318 provides a means for communicating with various other apparatus over a multi-wire interface 2320. Depending upon the nature of the apparatus, a user interface (e.g., keypad, display, speaker, microphone, joystick) may also be provided. One or more clock generation circuits may be provided within the processing circuit 2302 or controlled by the processing circuit 2302 and/or one or more processors 2312. In one example, the clock generation circuits may include one or more crystal oscillators, one or more phase-locked loop devices, and/or one or more configurable clock trees.

The processor 2312 is responsible for managing the bus 2316 and general processing, including the execution of software stored on the processor-readable storage medium 2314. The software, when executed by the processor 2312, causes the processing circuit 2302 to perform the various functions described supra for any particular apparatus. The processor-readable storage medium 2314 may be used for storing data that is manipulated by the processor 2312 when executing software.

In one configuration, the processing circuit may include one or more modules and/or circuits 2304 for receiving sequences of symbols from the multi-wire interface 2320, one or more modules and/or circuits 2306 for generating transition numbers from the sequences of symbols, one or more modules and/or circuits 2308 for decoding data words from the transition numbers, and one or more modules and/or circuits 2310 for detecting symbol errors using an EDC decoded from the transition numbers.

Those of skill in the art would appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing embodiments are merely examples and are not to be construed as limiting the invention. The description of the embodiments is intended to be illustrative, and not to limit the scope of the claims. As such, the present teachings can be readily applied to other types of apparatuses and many alternatives, modifications, and variations will be apparent to those skilled in the art.

What is claimed is:

1. A device comprising:
   a communications transceiver coupled to a plurality of connectors;
   an error code insertion circuit configured to append an error detection constant (EDC) to a data word;
   an encoder configured to convert the data word and the EDC into a transition number; and
   a transmitter circuit configured to transmit the transition number as a sequence of symbols on the plurality of connectors,
   wherein the EDC has a zero value and a length selected to enable a decoder to detect one or more symbol errors in the sequence of symbols, and wherein the EDC is appended as a predefined number of least significant bits, the predefined number of least significant bits being determined based on a total number of states per symbol available for encoding data transmissions on the plurality of connectors or based on a total number of symbols used to encode the data word.

2. The device of claim 1, wherein the encoder is configured to generate each symbol in the sequence of symbols using a digit of the transition number and a preceding symbol, and wherein clock information is embedded in transitions between consecutive symbols in the sequence of symbols.

3. The device of claim 1, wherein the plurality of connectors comprises a number (N) of single-ended connectors, the total number of states per symbol available for encoding data transmissions is $2^N-x$, wherein x is at least 1.

4. The device of claim 1, wherein the plurality of connectors comprises a number (N) of single-ended connectors, the total number of states per symbol available for encoding data transmissions is N!-x, wherein x is at least 1.

5. The device of claim 1, wherein a total number of states available at each transition is 3 and the EDC includes 8 bits.

6. The device of claim 1, wherein a total number of states available at each transition is 3, the sequence of symbols includes 17 or more symbols, and the EDC includes 9 bits.

7. The device of claim 1, wherein a total number of states available at each transition is 5 and the EDC includes 10 bits.

8. The device of claim 1, wherein a total number of states available at each transition is 5, the sequence of symbols includes 8 or more symbols, and the EDC includes 11 bits.

9. A method of transmitting data on a multi-wire interface, comprising:
   providing a plurality of bits to be transmitted over a plurality of connectors, wherein the plurality of bits includes an error detection constant (EDC);
   converting the plurality of bits into a transition number; and
   transmitting the transition number as a sequence of symbols on the plurality of connectors,
   wherein the transition number is expressed using a numeral system based on a maximum number of possible states per symbol,
   wherein the EDC has a zero value and a length selected to enable a decoder to detect one or more symbol errors in the sequence of symbols, and wherein the EDC is provided as a predefined number of least significant bits, the predefined number of least significant bits being determined based on a total number of states per symbol available for encoding data transmissions on the plurality of connectors or based on a total number of symbols used to encode the plurality of bits.

10. The method of claim 9, further comprising:
    generating each symbol in the sequence of symbols using a digit of the transition number and a preceding symbol in the sequence of symbols, wherein clock information is embedded in transitions between consecutive symbols in the sequence of symbols.

11. The method of claim 9, wherein a number of bits used as the EDC is selected such that a transmission error affecting one or more symbols in the sequence of symbols results in the EDC having non-zero value when decoded.

12. The method of claim 9, wherein a total number of states available at each transition is 3 and the EDC includes 8 bits.

13. The method of claim 9, wherein a total number of states available at each transition is 3, the sequence of symbols includes 17 or more symbols, and the EDC includes 9 bits.

14. The method of claim 9, wherein a total number of states available at each transition is 5 and the EDC includes 10 bits.

15. A method of receiving data from a multi-wire interface, comprising:
    receiving a sequence of symbols from a plurality of connectors;
    converting the sequence of symbols into a transition number, each digit of the transition number representing a transition between two consecutive symbols transmitted on the plurality of connectors;
    converting the transition number into a plurality of bits; and
    determining whether a symbol error has occurred during transmission of the sequence of symbols based on a value of an error detection constant (EDC) included in the plurality of bits,
    wherein the EDC has a zero value, and wherein the EDC is provided as a predefined number of least significant bits, the predefined number of least significant bits being determined based on a total number of states per symbol available for encoding data transmissions on the plurality of connectors or based on a total number of symbols used to encode the plurality of bits.

16. The method of claim 15, further comprising:
    determining that the symbol error has occurred when multiple symbol errors are present in the sequence of symbols,
    wherein the EDC has a number of bits, where the number is selected to enable detection of transmission errors affecting a plurality of symbols in the sequence of symbols.

17. The method of claim 15, wherein the transition number is expressed using a numeral system based on a maximum number of possible symbol transitions between a pair of consecutive symbols transmitted on the plurality of connectors.

18. The method of claim 15, wherein one or two symbol errors cause a decoded version of the EDC to have a non-zero value.

19. The method of claim 15, wherein the plurality of connectors comprises a number (N) single-ended connectors, the total number of states per symbol available for encoding data transmissions is $2^N-x$, wherein x is at least 1.

20. The method of claim 15, wherein the plurality of connectors comprises a number (N) of connectors that conduct multi-level differential signals, the total number of states per symbol available for encoding data transmissions is N!−x, wherein x is at least 1.

21. The method of claim 15, wherein a total number of states available at each transition is 3 and the EDC includes 8 bits.

22. The method of claim 15, wherein a total number of states available at each transition is 3, the sequence of symbols includes 17 or more symbols, and the EDC includes 9 bits.

23. The method of claim 15, wherein a total number of states available at each transition is 5 and the EDC includes 10 bits.

24. The method of claim 15, wherein a total number of states available at each transition is 5, the sequence of symbols includes 8 or more symbols, and the EDC includes 11 bits.

25. An apparatus comprising:
  means for receiving a sequence of symbols from a plurality of connectors, including a clock recovery circuit configured to provide a clock signal used to receive the sequence of symbols;
  means for converting the sequence of symbols into a transition number, each digit of the transition number representing a transition between two consecutive symbols transmitted on the plurality of connectors;
  means for converting the transition number into a plurality of bits; and
  means for determining whether a symbol error has occurred during transmission of the sequence of symbols based on a value of an error detection constant (EDC) included in the plurality of bits,
  wherein the EDC has zero value, and wherein the EDC is provided as a predefined number of least significant bits, the predefined number of least significant bits being determined based on a total number of states per symbol available for encoding data transmissions on the plurality of connectors or based on a total number of symbols used to encode the plurality of bits.

\* \* \* \* \*